United States Patent
Kim et al.

(10) Patent No.: US 12,260,539 B2
(45) Date of Patent: Mar. 25, 2025

(54) APPARATUS AND METHOD OF MEASURING UNIFORMITY BASED ON PUPIL IMAGE AND METHOD OF MANUFACTURING MASK BY USING THE METHOD

(71) Applicant: Samsung Electronics Co., Ltd., Suwon-si (KR)

(72) Inventors: Minho Kim, Yongin-si (KR); Hakseung Han, Hwaseong-si (KR); Jiyoung Kim, Hwaseong-si (KR); Jinback Park, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 150 days.

(21) Appl. No.: 18/093,030

(22) Filed: Jan. 4, 2023

(65) Prior Publication Data
US 2023/0142328 A1 May 11, 2023

Related U.S. Application Data

(62) Division of application No. 17/189,893, filed on Mar. 2, 2021, now Pat. No. 11,562,477.

(30) Foreign Application Priority Data
Jul. 7, 2020 (KR) .................. 10-2020-0083673

(51) Int. Cl.
*G06K 9/00* (2022.01)
*G01N 21/95* (2006.01)
(Continued)

(52) U.S. Cl.
CPC ....... *G06T 7/0006* (2013.01); *G01N 21/9501* (2013.01); *G02B 27/14* (2013.01); *G06T 2207/30148* (2013.01)

(58) Field of Classification Search
CPC ........ G06T 7/0006; G06T 2207/30148; G01N 21/9501; G01N 21/956;
(Continued)

(56) References Cited

U.S. PATENT DOCUMENTS 7,552,625 B2 * 6/2009 Degertekin ............ B82Y 35/00
73/105
8,355,044 B2  1/2013 Tsuchiya et al.
(Continued)

FOREIGN PATENT DOCUMENTS

CN  111307772 B  * 12/2020  ......... G02B 21/0036
JP  2677217 B2  11/1997
(Continued)

*Primary Examiner* — Shervin K Nakhjavan
(74) *Attorney, Agent, or Firm* — Muir Patent Law, PLLC

(57) ABSTRACT

An apparatus and method of measuring pattern uniformity, and a method of manufacturing a mask by using the measurement method are provided. The measurement apparatus includes a light source configured to generate and output light, a stage configured to support a measurement target, an optical system configured to transfer the light, output from the light source, to the measurement target supported on the stage, and a first detector configured to detect light reflected and diffracted by the measurement target, or diffracted by passing through the measurement target, wherein the first detector is configured to detect a pupil image of a pupil plane and to measure pattern uniformity of an array area of the measurement target on the basis of intensity of at least one of zero-order light and $1^{st}$-order light of the pupil image.

11 Claims, 17 Drawing Sheets

(51) Int. Cl.
*G02B 27/14* (2006.01)
*G06T 7/00* (2017.01)

(58) Field of Classification Search
CPC ..... G01N 2021/95676; G01N 21/4788; G01N 21/8851; G01N 2021/8887; G02B 27/14; G02B 21/0016; G02B 27/286; H01L 22/12; G03F 7/70616; G03F 1/84
See application file for complete search history.

(56) References Cited

U.S. PATENT DOCUMENTS

| | | | |
|---|---|---|---|
| 8,384,876 | B2 | 2/2013 | Heo et al. |
| 8,435,705 | B2 | 5/2013 | Han et al. |
| 8,643,822 | B2 * | 2/2014 | Tan ............ G03H 1/22 349/129 |
| 10,295,477 | B2 | 5/2019 | Terasawa et al. |
| 10,342,108 | B2 * | 7/2019 | Polyakov ............ G03F 7/70625 |
| 10,572,995 | B2 | 2/2020 | Inoue et al. |
| 2002/0021460 | A1 * | 2/2002 | Hansen ............ G03F 7/706 359/1 |
| 2002/0135929 | A1 * | 9/2002 | Edwards ............ G11B 5/5508 |
| 2004/0133872 | A1 * | 7/2004 | Fukuhara ............ G03F 1/70 716/51 |
| 2005/0037143 | A1 * | 2/2005 | Chou ............ B29C 43/021 427/248.1 |
| 2005/0286044 | A1 * | 12/2005 | Huibers ............ G01N 21/95 356/237.1 |
| 2007/0121090 | A1 * | 5/2007 | Chen ............ G03F 7/705 355/53 |
| 2008/0056103 | A1 * | 3/2008 | Kawasaki ............ G11B 7/1353 369/116 |
| 2011/0304837 | A1 * | 12/2011 | Patra ............ G03F 7/70025 372/29.014 |
| 2012/0206703 | A1 * | 8/2012 | Bhattacharyya ............ G03F 7/70625 356/612 |
| 2015/0176985 | A1 * | 6/2015 | Shchegrov ............ G01B 11/272 356/614 |
| 2016/0266056 | A1 * | 9/2016 | Ruth ............ G01N 23/207 |
| 2017/0176338 | A1 * | 6/2017 | Wu ............ G01N 21/6428 |
| 2018/0082415 | A1 * | 3/2018 | Sezginer ............ G06T 7/001 |
| 2018/0341182 | A1 * | 11/2018 | Sanguinetti ............ G03F 7/70133 |
| 2019/0212660 | A1 * | 7/2019 | Kumar ............ G03F 7/70516 |
| 2019/0317413 | A1 * | 10/2019 | Cheng ............ G03F 7/70633 |
| 2020/0081350 | A1 * | 3/2020 | Gruner ............ G02B 17/0657 |
| 2021/0132509 | A1 * | 5/2021 | Huisman ............ G03F 7/70641 |
| 2022/0121129 | A1 * | 4/2022 | Lin ............ G03F 7/70616 |
| 2022/0282154 | A1 * | 9/2022 | Ahn ............ C09D 11/52 |

FOREIGN PATENT DOCUMENTS

| | | | | |
|---|---|---|---|---|
| JP | 2009300426 A | | 12/2009 | |
| JP | 2010019639 A | * | 1/2010 | ............ G01N 21/95 |
| KR | 1020050092555 A | | 9/2005 | |
| KR | 101136865 B1 | | 4/2012 | |
| KR | 20190105576 A | * | 9/2019 | ............ G02B 6/0023 |
| KR | 102048347 B1 | * | 11/2019 | ............ H01L 21/67242 |
| WO | WO-2019206586 A1 | * | 10/2019 | ............ G03F 7/70191 |

* cited by examiner

APPARATUS AND METHOD OF MEASURING UNIFORMITY BASED ON PUPIL IMAGE AND METHOD OF MANUFACTURING MASK BY USING THE METHOD

CROSS-REFERENCE TO RELATED APPLICATION

This application is a Divisional application of U.S. patent application Ser. No. 17/189,893, filed Mar. 2, 2021, which claims priority under 35 U. S.C. § 119 to Korean Patent Application No. 10-2020-0083673, filed on Jul. 7, 2020, in the Korean Intellectual Property Office, the disclosure of each of which is incorporated by reference herein in its entirety.

BACKGROUND

Aspects of the inventive concept relate to a measurement apparatus and a measurement method, and particularly, a measurement apparatus and a measurement method based on a pupil image.

Recently, in semiconductor manufacturing processes, design rules are being continuously shrunk, and thus, sizes of patterns are being progressively reduced. Also, in terms of a measurement apparatus for measuring a pattern of a wafer or a mask, a resolution issue caused by a reduced pattern size may occur, and the accuracy of measurement may be reduced. In order to address such problems, methods of enhancing optical resolution are being continuously researched and developed. The methods of enhancing the optical resolution include a method of implementing a short wavelength and a method of implementing a high numerical aperture (NA). The method of implementing a short wavelength may have a limitation because the amount of light may be insufficient. Also, the method of implementing a high NA may have a physical limitation in increasing a size of an objective lens.

SUMMARY

Aspects of the inventive concept provide an apparatus and method of measuring pattern uniformity, which may accurately measure the uniformity of patterns in an array area of a measurement target, and a method of manufacturing a mask by using the measurement method.

According to an aspect of the inventive concept, there is provided an apparatus for measuring pattern uniformity on the basis of a pupil image, the apparatus including a light source configured to generate and output light, a stage configured to support a measurement target, an optical system configured to transfer the light, output from the light source, to the measurement target supported on the stage, and a first detector configured to detect light reflected and diffracted by the measurement target, or to detect light diffracted by passing through the measurement target, wherein the first detector is configured to detect a pupil image of a pupil plane and to measure pattern uniformity of an array area of the measurement target on the basis of intensity of at least one of zero-order light and $1^{st}$-order light of the pupil image.

According to another aspect of the inventive concept, there is provided an apparatus for measuring pattern uniformity on the basis of a pupil image, the apparatus including a light source configured to generate and output light, a stage configured to support a mask, an optical system including a beam splitter configured to split the light into first light and second light, the optical system being configured to transfer the first light to the mask, and a first detector configured to detect the first light after the first light is reflected and diffracted by the mask, or to detect the first light after the first light is diffracted by passing through the mask, and a second detector configured to detect the second light, wherein each of the first detector and the second detector is configured to detect a pupil image of a pupil plane, and the first detector is configured to measure pattern uniformity of an array area of the mask on the basis of intensity of at least one of zero-order light and $1^{st}$-order light of the pupil image.

According to another aspect of the inventive concept, there is provided a method of measuring pattern uniformity on the basis of a pupil image, the method including generating and outputting light by using a light source, transferring, by using an optical system, the light from the light source to a measurement target disposed on a stage, detecting, by using a first detector, light reflected and diffracted by the measurement target or light diffracted by passing through the measurement target, and measuring pattern uniformity of an array area of the measurement target on the basis of the light detected by the first detector, wherein the detecting of the light includes detecting a pupil image of a pupil plane by using the first detector, and the measuring of the pattern uniformity includes measuring the pattern uniformity on the basis of intensity of at least one of zero-order light and $1^{st}$-order light of the pupil image.

According to another aspect of the inventive concept, there is provided a method of manufacturing a mask, the method including preparing a mask having an array area, generating and outputting light by using a light source, transferring, by using an optical system, the light from the light source to the mask disposed on a stage, detecting, by using a first detector, light reflected and diffracted by the mask or light diffracted by passing through the mask, and measuring pattern uniformity of the array area on the basis of the light detected by the first detector, wherein the detecting of the light includes detecting a pupil image of a pupil plane by using the first detector, and the measuring of the pattern uniformity is performed on the basis of intensity of at least one of zero-order light and $1^{st}$-order light of the pupil image.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, embodiments will be described in detail with reference to the accompanying drawings. Like numeral references refer to like elements, and their repetitive descriptions are omitted.

Figure 1:
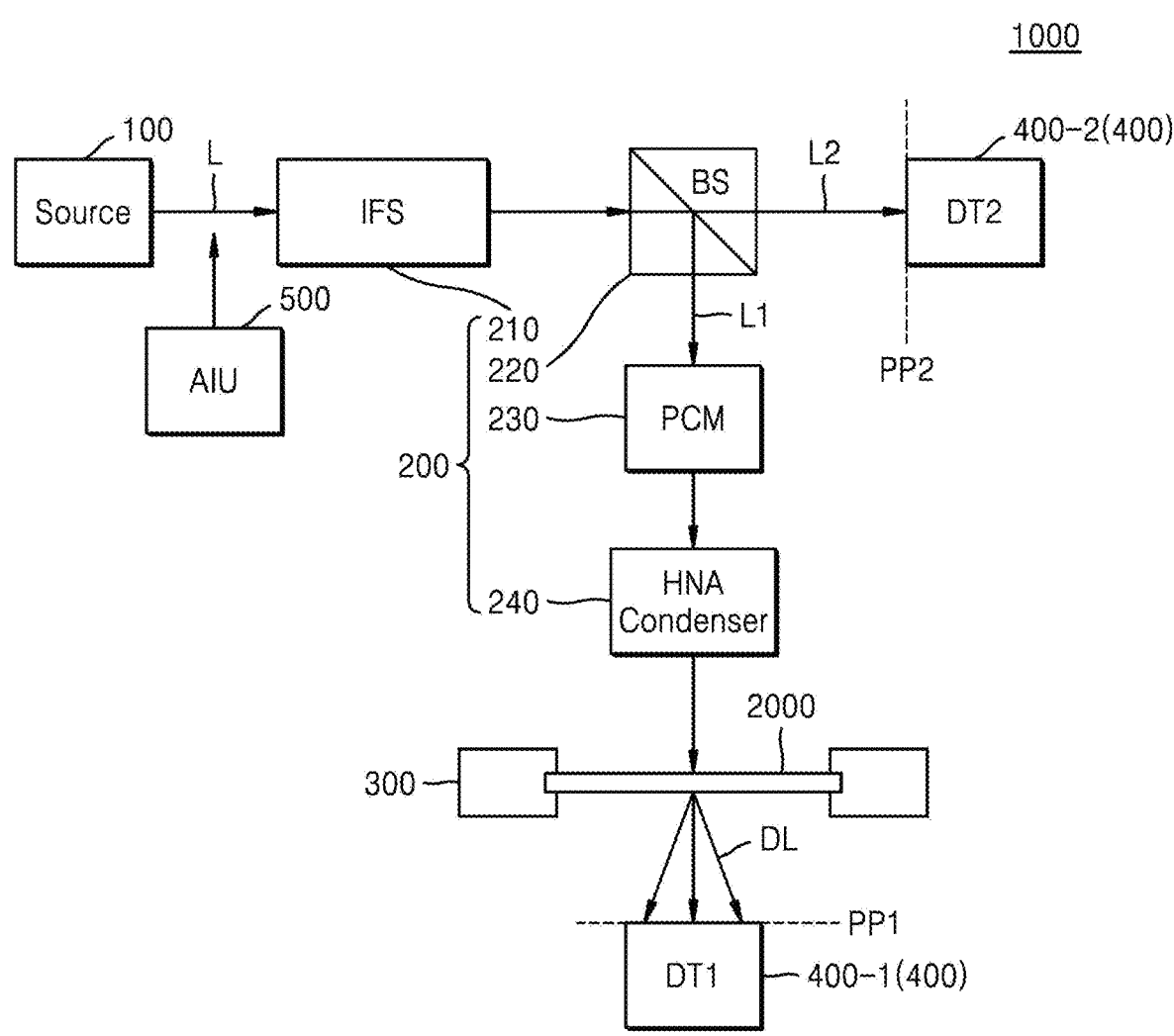
FIG. 1 is a block diagram of a measurement apparatus for measuring pattern uniformity on the basis of a pupil image, according to an embodiment.

FIG. 1 is a block diagram of an apparatus 1000 for measuring pattern uniformity on the basis of a pupil image, according to an embodiment.

Referring to FIG. 1, the apparatus 1000 for measuring pattern uniformity (hereinafter referred to as a measurement apparatus) on the basis of a pupil image according to an embodiment may be an apparatus for measuring the uniformity of a pattern in an array area of a measurement target 2000. The measurement apparatus 1000 according to an embodiment may include a light source 100, an optical system 200, a stage 300, a detection unit 400, and an advanced illumination unit (AIU) 500. The pupil image in this disclosure may be an image representing a diffracted light including an information of a zero-order light and a $1^{st}$-order light of the diffracted light. The pupil image may refer to an image formed based on light passing through an aperture, without later passing through a condenser lens (e.g., a focusing lens or collimator).

The light source 100 may be a device which generates and outputs light L. The light L of the light source 100 may include or may be a laser. The laser output from the light source 100 may include or may be a pulse laser, and for example, may include or may be a laser having a pulse width of about 500 Hz to about 1 kHz. The light L of the light source 100 is not limited to the pulse laser. Also, a pulse width of the pulse laser is not limited to the numerical value. For example, according to an embodiment, the light L of the light source 100 may include or may be a continuous wave laser.

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The light source 100 may generate and output light having various wavelengths. For example, the light source 100 may generate and output light having a wavelength of about 200 nm such as 248 nm (KrF), 193 nm (ArF), or 157 nm (F2). For example, the laser beam may have a wavelength between 150 nm and 250 nm. A wavelength of the light L of the light source 100 is not limited to the wavelengths. For example, the light source 100 may generate and output extreme ultraviolet (EUV) light corresponding to tens of nanometers.

The optical system 200 may transfer the light L, output from the light source 100, to the measurement target 2000. The optical system 200 may include an illumination formation system (IFS) 210, a beam splitter 220, a polarization control module (PCM) 230, and a high numerical aperture (NA) (HNA) condenser 240.

The IFS 210 may include various elements, and the IFS 210 may shape the light L, output from the light source 100, into an appropriate shape and may transfer the shaped light L to the beam splitter 220. For example, based on a size or a shape of a pattern in an array area of the measurement target 2000, the IFS 210 may shape light into a shape which enables the uniformity of the pattern to be optimally measured and may transfer the shaped light to the beam splitter 220. The elements of the IFS 210 will be described in more detail with reference to FIG. 2.

The beam splitter 220 may split the light L, output from the IFS 210, into two pieces of light. For example, the beam splitter 220 may split the light L, output from the IFS 210, into first light L1 and second light L2. As illustrated in FIG. 1, the beam splitter 220 may reflect a portion of the light L from the IFS 210 to allow the first light L1 to be irradiated onto the measurement target 2000 and may transmit the other portion of the light L to allow the second light L2 to be irradiated onto a second detector 400-2.

The PCM 230 may control a polarization state of the first light L1 by using a polarizing filter. For example, the PCM 230 may perform polarization, such as linear polarization, circular polarization, or elliptical polarization, on the first light L1 by using the polarizing filter to polarize the first light L1. For example, the PCM 230 may polarize the first light L1 to have a polarization direction. In some embodiments, the PCM 230 may be disposed between the IFS 210 and the beam splitter 220. In certain embodiments, the PCM 230 may be omitted.

The HNA condenser 240 may include an objective lens which focuses light and may have a high NA of 1 or more. For example, the HNA condenser 240 may condense the first light L1 and may irradiate the condensed first light L1 onto the measurement target 2000. According to an embodiment, a medium NA (MNA) condenser having an NA of less than 1 may be provided. For example, in some embodiments, the measurement apparatus 1000 may include an MNA instead of the HNA of FIG. 1. In certain embodiments, the HNA condenser 240 and the MNA condenser may be provided together, e.g., in a serial arrangement along a light path of the first light L1.

The measurement target 2000 may be disposed on the stage 300. The stage 300 may support and fix the measurement target 2000. The measurement apparatus 1000 according to an embodiment may include or may be, for example, a transmissive measurement apparatus which measures light diffracted by passing through the measurement target 2000. Therefore, the stage 300 may support and fix a side surface and/or edge portions of the measurement target 2000. The stage 300 may include or may be a three-dimensional (3D) movement stage which may three-dimensionally move. As the stage 300 moves, the measurement target 2000 may move together therewith. For example, based on the movement of the stage 300, focusing with respect to a Z axis or scanning with respect to an X-Y plane may be performed on the measurement target 2000. For example, the measurement target 2000 may be detected through a full scanning of the entire surface of the measurement target 2000. Here, the Z axis may correspond to a light axis of the first light L1, and the X-Y plane may correspond to a plane perpendicular to the light axis of the first light L1.

The measurement target 2000 may include a device where a plurality of repetition patterns are included in an array area like a mask or a wafer. For example, the array area may include an array of repeating patterns. For example, in the measurement apparatus 1000 according to an embodiment, the measurement target 2000 may include or may be a mask where a plurality of repetition patterns are included in an array area. Therefore, the measurement apparatus 1000 according to an embodiment may include or may be an apparatus which measures the uniformity of a pattern in an array area of a mask.

The detection unit 400 may include a first detector (DT1) 400-1 and a second detector (DT2) 400-2. According to an embodiment, the detection unit 400 may include only the first detector 400-1.

Figure 9:
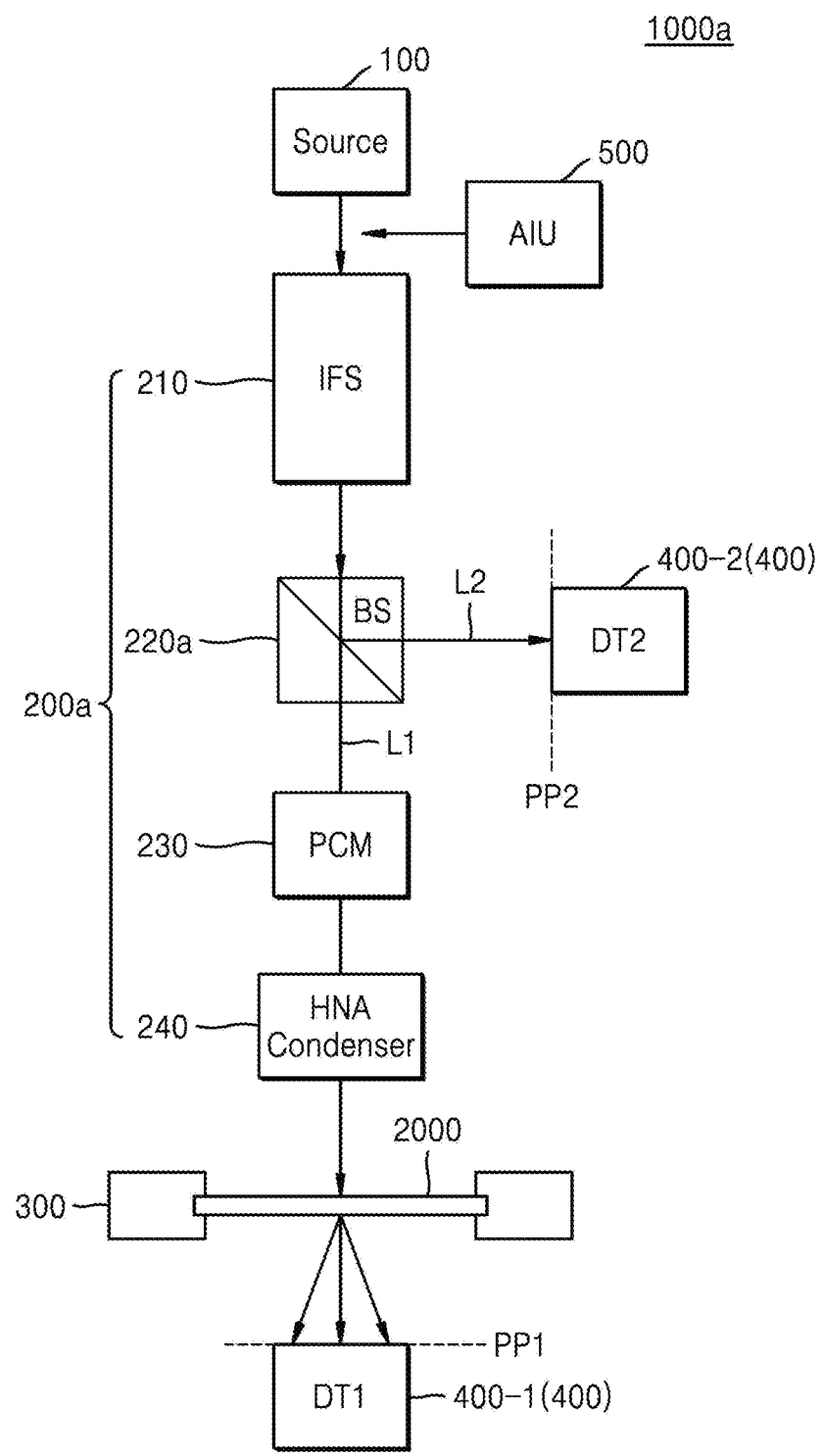
FIGS. 9 and 10 are block diagrams of a measurement apparatus for measuring pattern uniformity on the basis of a pupil image, according to embodiments.
Figure 10:
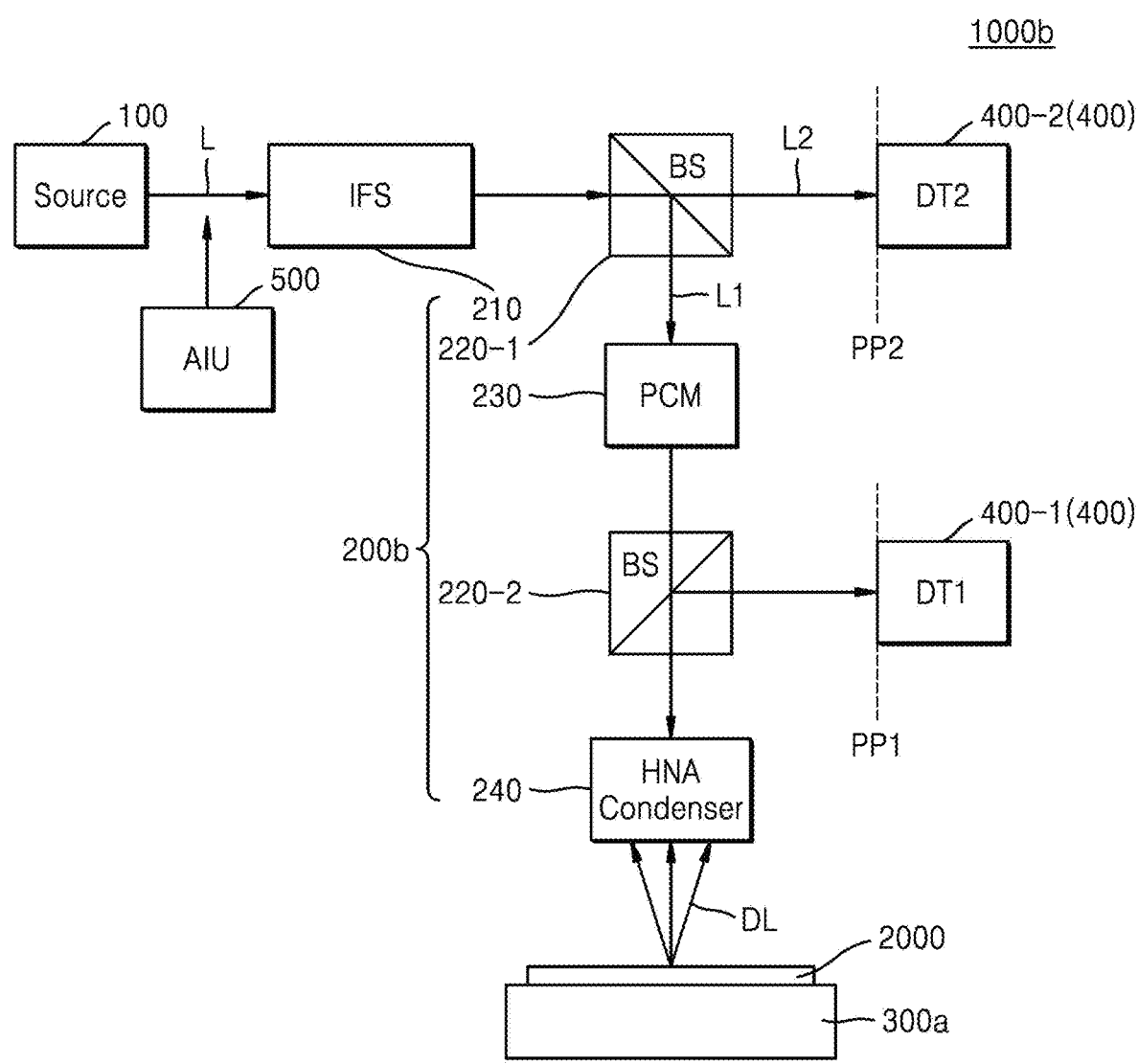

The first detector 400-1 may detect light which is generated when the first light L1 is diffracted by passing through the measurement target 2000. For example, the first light L1 may be diffracted after passing through the measurement target 2000, and the detector 400-1 may detect the diffracted light. In the measurement apparatus 1000 according to an embodiment, the first detector 400-1 may detect an image (i.e., a pupil image) at a pupil plane PP1 corresponding to diffracted light. In FIG. 1, the pupil plane PP1 corresponding to the diffracted light is illustrated by a dashed line. In the measurement apparatus 1000 according to an embodiment, the first detector 400-1 may directly detect a pupil image, and thus, may not need a separate condensing lens for condensing diffracted light. The first detector 400-1 may include or may be, for example, a charge-coupled device (CCD) or a photo-multiplier tube (PMT). The first detector 400-1 is not limited to the above-described devices. Pupil planes in this disclosure may be planes corresponding to incident surfaces of light detectors on which light intensities are detected as shown in FIGS. 9 and 10. The pupil plane may refer to a plane at which a pupil image is received. For example, a pupil image may be created after light passes through HNA condenser 240, which image may be diffracted by passing through the measurement target 2000. An image received at a pupil plane such as PP1 (e.g., at a detector arranged on that plane), may be described as a pupil image.

As illustrated in FIG. 1, light passing through the measurement target 2000 may be diffracted based on a pattern of the measurement target 2000. Light (i.e., diffracted light DL) diffracted through the measurement target 2000 may include pieces of high-order light at a periphery as well as zero-order light at a center. In FIG. 1, for convenience, only zero-order light and $1^{st}$-order light are illustrated. In pieces of higher-order light (for example, $1^{st}$-order light), an angle (i.e., a diffraction angle) diffracted based on a size or a pitch of a pattern of the measurement target 2000 may vary (see θd1 of FIG. 3A). An example, where a diffraction angle of $1^{st}$-order light varies based on a size or a pitch of a pattern, will be described below in more detail with reference to FIGS. 3A and 3B.

In the measurement apparatus 1000 according to an embodiment, the first detector 400-1 may move on a horizontal plane perpendicular to an optical axis of the diffraction light DL. The first detector 400-1 may move, and thus, when a diffraction angle of each of pieces of $1^{st}$-order or a higher light is large, the first detector 400-1 may move to sufficiently detect a pupil image of an array area of the measurement target 2000.

In the measurement apparatus 1000 according to an embodiment, the first detector 400-1 may have a size of one shot, which is relatively small. For example, the first detector 400-1 may have a size of one shot of about 40 μm*40 μm. However, a size of one shot of the first detector 400-1 is not limited to 40 μm*40 μm. For example, the size of one shot of the first detector 400-1 may be between 1000 μm$^2$ and 2000 μm$^2$. As described above, in the measurement apparatus 1000 according to an embodiment, a size of one shot of the first detector 400-1 may be reduced to be small, and thus, an accuracy of measuring pattern uniformity may be enhanced.

To provide description for reducing a size of one shot of the first detector 400-1, in measuring pattern uniformity, whether only a signal of an array area is included in a shot or a signal of an array area and a signal of a non-array area are included in the shot has to be determined before measuring pattern uniformity on the basis of the analysis of an image of the shot. Here, the array area may denote an area including the same repeating pattern, and the non-array area may denote an area including no pattern or an area including a pattern differing from a pattern of the array area and may be a concept opposite to the array area. For example, the array area may be an area including an array of repeating patterns, and the non-array area may be an area including irregular patterns and/or a blank without any pattern.

A method mainly used for determining whether the signal of the non-array area is included in a shot may include a method of filtering whether there is a portion where intensity varies largely (e.g., greater than a predetermined value/difference), e.g., by positions, after imaging of a corresponding shot. For example, when only the signal of the array area is included in one shot, intensity does not largely vary (e.g., it only varies less than the predetermined value/difference) in an image corresponding to the one shot, but when the signal of the non-array area is included in one shot, there may be a portion where intensity varies largely (e.g., it varies greater than the predetermined value/difference) in an image corresponding to the one shot. However, recently, as sizes of patterns are progressively miniaturized, a pattern may be finely changed between the array area and the non-array area, and thus, an intensity difference may not be large enough to be distinguished in an image. As a result, in measuring pattern uniformity, the signal of the non-array may not be removed and may act as noise. For example, accuracy of measurements may deteriorate because of reduced pattern sizes.

In a measurement apparatus of the related art, a size of one shot is about 180 μm*90 μm and may be too large to measure pattern uniformity, and thus, a possibility of including noise in measuring pattern uniformity is high. For example, because a size of one shot is large, there is high possibility that the signal of the non-array area is included in the one shot, and as described above, as a pattern is progressively miniaturized, an image of a shot including the non-array area may not be removed and may be used to measure pattern uniformity, whereby the signal of the non-array may act as noise, e.g., leading to a wrong result of the uniformity measurement of the array pattern. As a result, in the measurement apparatus of the related art, an accuracy of measuring pattern uniformity may be low due to a size of one shot which is relatively large.

On the other hand, in the measurement apparatus 1000 according to the present embodiment, a size of one shot of the first detector 400-1 may be about 40 μm*40 μm and may be 10 or more times less than a size of one shot of the measurement apparatus of the related art. Therefore, the possibility of including noise in measuring pattern uniformity may be relatively lowered. As a result, in the measurement apparatus 1000 according to the present embodiment, an accuracy of measuring pattern uniformity may be relatively high due to a small size of one shot.

However, as a size of one shot of the first detector 400-1 is reduced, a time for detecting pupil images of all of an array area of the measurement target 2000 by using the first detector 400-1 may increase. Accordingly, the following methods for reducing a time may be applied to the measurement apparatus 1000 according to the present embodiment. A first method may be a method of constructing a focus map. For example, a focus map may be constructed, and a pupil image may be detected by automatically adjusting a focus on the basis of the focus map, thereby considerably decreasing a time for detecting the pupil image. For example, the focus map may be a map including information of focusing distances from the first detector 400-1 at respective positions of the measurement target 2000. A process of constructing a focus map will be described below in more detail with reference to FIG. 11D. A second method may be a method of detecting a pupil image corresponding to only predetermined positions of the array area of the measurement target 2000 through sampling, instead of detecting a pupil image corresponding to all of the array area of the measurement target 2000. Considering that photographing is performed tens of thousands to hundreds of thousands times, for obtaining pupil images corresponding to all of the array area of the measurement target 2000, a position for obtaining a pupil image may be limited to only positions which are set through sampling, and thus, a time for detecting a pupil image may be considerably reduced.

The measurement apparatus 1000 according to the present embodiment may detect a pupil image by using the first detector 400-1, select a pupil image including only an array area by using an on-off selection method, and use the selected pupil image in measuring pattern uniformity, thereby more enhancing an accuracy of measuring pattern uniformity. For example, the on-off selection method may be a method setting a reference boundary of a category and one side of the boundary is to be in the category (on) and the other side of the boundary is to be out of the category (off). An operation of detecting a pupil image and the on-off selection method will be described below in more detail with reference to FIGS. 4A to 6B.

The second detector 400-2 may detect second light L2 coming from the beam splitter 220. The second detector 400-2 may detect an image (i.e., a pupil image) of a pupil plane PP2 corresponding to the second light L2. In FIG. 1, the pupil plane PP2 corresponding to the second light L2 is illustrated by a dashed line. For example, the second detector 400-2 may include a CCD or a PMT. However, the second detector 400-2 is not limited to the CCD or the PMT. The second detector 400-2 may directly detect the second light L2 from the beam splitter 220 to sense fluctuation of the second light L2 in real time. For example, the second detector 400-2 may sense a variation of laser power in real time. Fluctuation information about light (e.g., emitting from the light source 100) obtained through the second detector 400-2 may be used to correct/compensate pattern uniformity and/or a pupil image obtained through the first detector 400-1. An operation of detecting fluctuation of light by using the second detector 400-2 and an operation of correcting/compensating pattern uniformity and/or a pupil image by using fluctuation information about light will be described below in more detail with reference to FIGS. 8A and 8B. When light emitting from the light source 100 is uniform and thus hardly fluctuates, the second detector 400-2 may be omitted according to some embodiments.

The AIU 500 may be disposed between the light source 100 and the IFS 210. The AIU 500 may delay a pulse laser to increase energy of light incident on the IFS 210. As a result, the AIU 500 may increase energy of light irradiated onto the measurement target 2000, thereby enabling high-magnification measurement. According to certain embodiments, the AIU 500 may be omitted.

The measurement apparatus 1000 according to the present embodiment may detect a pupil image of a pattern of the array area of the measurement apparatus 2000 by using the first detector 400-1 where a size of one shot thereof is small (e.g., having a size mentioned above), and may determine pattern uniformity on the basis of the intensity of the pupil image, thereby measuring the pattern uniformity of the array area of the measurement target 2000 at a high accuracy. Also, based on the on-off selection method, the measurement apparatus 1000 according to the present embodiment may select a pupil image including only an array area and may use the selected pupil image in measuring pattern uniformity or extracting data, thereby enhancing an accuracy of measuring pattern uniformity. Furthermore, the measurement apparatus 1000 according to the present embodiment may obtain information about fluctuation of light by using the second detector 400-2 and may correct/compensate pattern uniformity and/or a pupil image obtained through the first detector 400-1, thereby enhancing an accuracy of measuring pattern uniformity. For example, the on-off selection method may be carried out by hardware/software, e.g., by a computer including a processor, etc.

Figure 2:
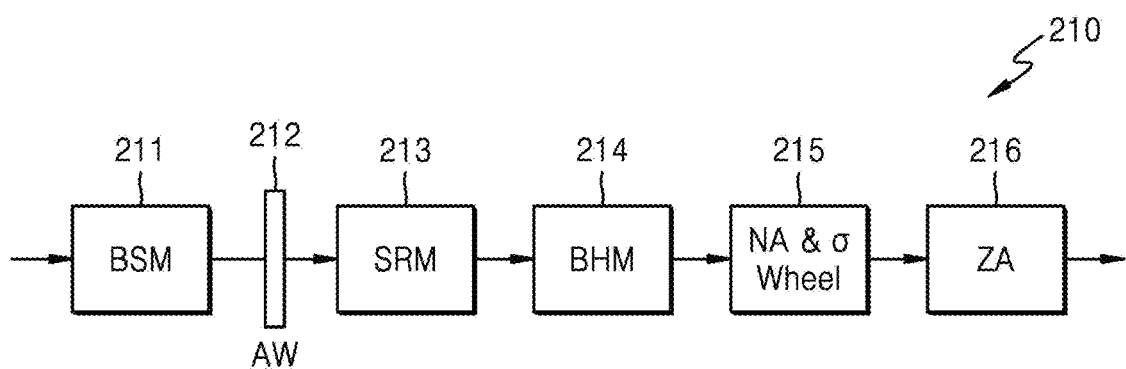
FIG. 2 is a block diagram illustrating in more detail an illumination formation system (IFS) in the measurement apparatus of FIG. 1.

FIG. 2 is a block diagram illustrating in more detail an IFS 210 in the measurement apparatus 1000 of FIG. 1. Hereinafter, the IFS 210 will be described with reference to FIGS. 1 and 2, and description given above with reference to FIG. 1 will be briefly given or will be omitted.

Referring to FIG. 2, the IFS 210 may include a beam steering module (BSM) 211, an attenuation wheel (AW) 212, a speckle reduction module (SRM) 213, a beam homogenizer module (BHM) 214, an NA & σ wheel 215, and a zoom adaptor (ZA) 216. The BSM 211 may perform a function of adjusting a focus of light. The AW 212 may perform a function of adjusting attenuation of light. The SRM 213 may perform a function of removing a speckle, such as interference dots, of light (for example, a laser). The BHM 214 may perform a filtering function to maintain only light having the same wavelength. The NA & σ wheel 215 may perform a function of adjusting a shape and a size of an aperture. The ZA 216 may adjust a focus of light.

In the measurement apparatus 1000 according to the present embodiment, the IFS 210 may include all of the elements described above. However, according to some embodiments, the IFS 210 may not include some of the elements described above. According to certain embodiments, the IFS 210 may further include elements other than the elements described above.

Figure 3A:
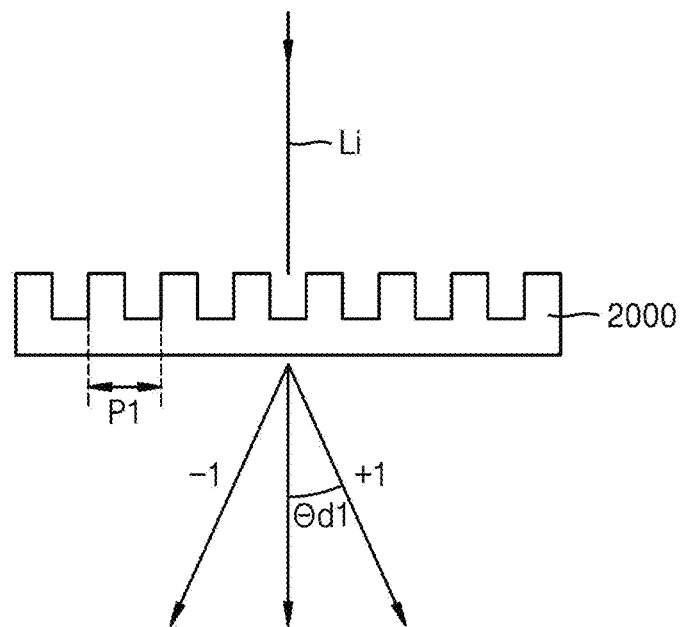
FIGS. 3A and 3B are conceptual diagrams for describing a relationship between a pitch of a pattern and a diffraction angle of diffracted light in the pattern.
Figure 3B:
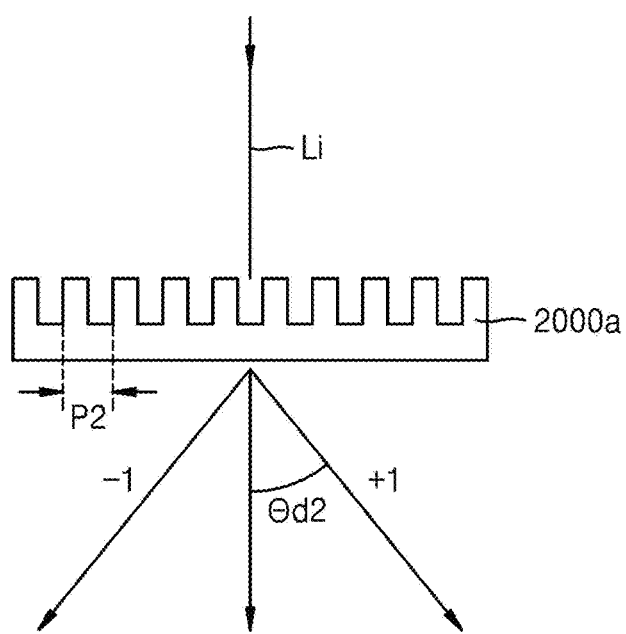

FIGS. 3A and 3B are conceptual diagrams for describing a relationship between a pitch of a pattern and a diffraction angle of diffracted light by the pattern and each show a pattern of a measurement target, incident light, and a shape of after-transmission diffracted light.

Referring to FIGS. 3A and 3B, incident light Li may be incident on a measurement target 2000 and may be diffracted by passing through the measurement target 2000. Light (i.e., diffracted light) diffracted through the measurement target 2000 may include zero-order light at a center and $1^{st}$-order light (−1, +1) at both sides with respect to the zero-order light. The diffracted light may include $2^{nd}$ or higher-order light. However, in the measurement apparatus 1000 according to the present embodiment, $2^{nd}$ and higher-order light may not be used to measure pattern uniformity, and thus, are omitted and not illustrated in FIGS. 3A and 3B. Hereinafter, an operation of measuring the uniformity of a pattern by using zero-order light and $1^{st}$-order light (−1, +1) will be described for example.

A pattern of the measurement target 2000 of FIG. 3A may have a first pitch P1, and a pattern of a measurement target 2000a of FIG. 3B may have a second pitch P2. The first pitch P1 may be greater than the second pitch P2. In FIG. 3A, a diffraction angle of $1^{st}$-order light (−1, +1) may have a first diffraction angle θd1, and in FIG. 3B, a diffraction angle of $1^{st}$-order light (−1, +1) may have a second diffraction angle θd2. Here, a diffraction angle of $1^{st}$-order light (−1, +1) may be defined as an angle between a proceeding direction of the $1^{st}$-order light (−1, +1) and an optical axis.

Generally, in light diffracted by a pattern having a certain shape (for example, a pattern having a line & space shape, e.g., a stripe pattern), as a pitch of a pattern is reduced, a diffraction angle of $1^{st}$-order light (−1, +1) may increase. Therefore, as seen in FIGS. 3A and 3B, the first diffraction angle θd1 of the $1^{st}$-order light (−1, +1) in the measurement target 2000 including a pattern of the first pitch P1 may be less than the second diffraction angle θd2 of the $1^{st}$-order light (−1, +1) in the measurement target 2000a in that the second pitch P2 is smaller than the first pitch P1.

Therefore, whether only a signal of an array area is included in one shot or a signal of the array area and a signal of an area (i.e., a non-array area) other than the array area are included in the one shot may be determined based on that a diffraction angle of diffracted light (for example, $1^{st}$-order light) varies according to a size or a pitch of a pattern. For example, in an array area where uniform patterns are included in one shot, diffracted light (for example, $1^{st}$-order light) may include only a certain diffraction angle. On the other hand, when an array area and a non-array area are included in one shot, $1^{st}$-order light outside a certain diffraction angle range may be generated.

An on-off selection method, which selects a pupil image including only an array area by determining whether only an array area is included in one shot or an array area and a non-array area are included in the one shot, will be described in more detail with reference to FIGS. 4A to 6B.

Figure 4A:
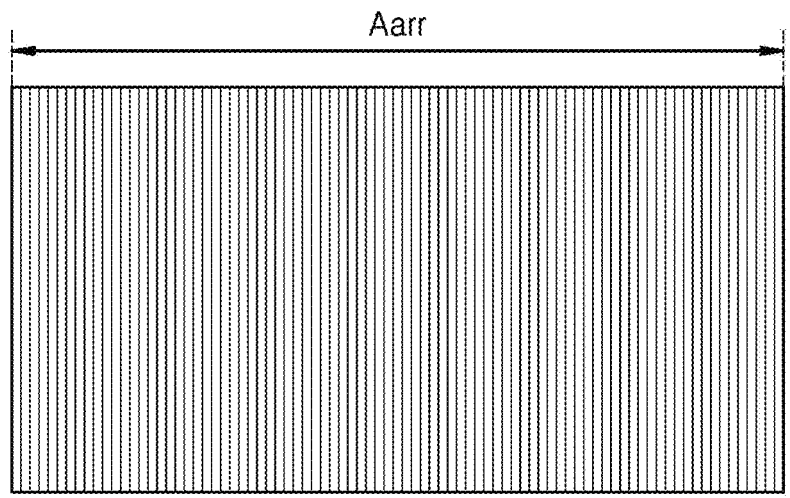
FIGS. 4A and 4B are conceptual diagrams illustrating a shape of an array area included in one shot of a first detector.
Figure 4B:
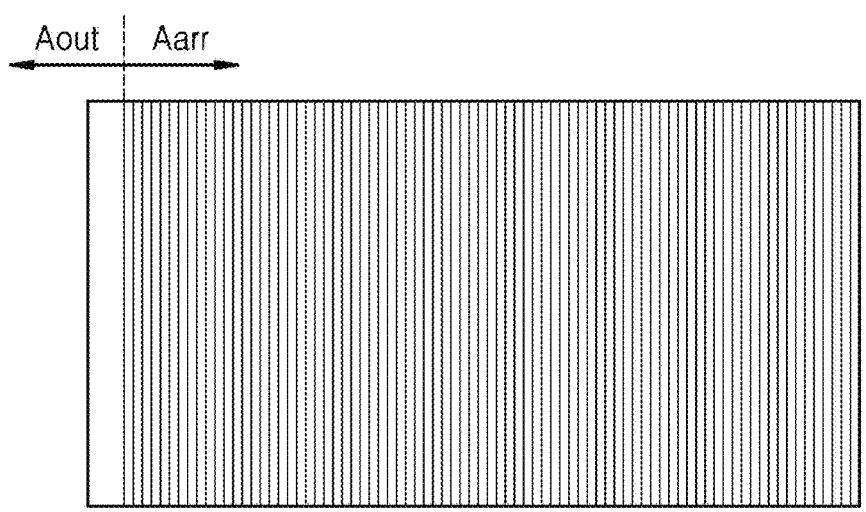

FIGS. 4A and 4B are conceptual diagrams illustrating a shape of an array area included in one shot of a first detector. FIG. 4A shows an example where only an array area is included in one shot, and FIG. 4B shows an example where an array area and a non-array area are included in one shot.

Referring to FIGS. 4A and 4B, in FIG. 4A, only an array area Aarr may be included in one shot, and for example, a uniform pattern having a line & space shape may be included in the array area Aarr. In FIG. 4B, an array area Aarr and a non-array area (for example, an external area Aout) may be included in one shot. Like the array area Aarr of FIG. 4A, a uniform pattern having a line & space shape may be included in the array area Aarr. However, as shown in FIG. 4B, there is no pattern included in the external area Aout.

Figure 5A:
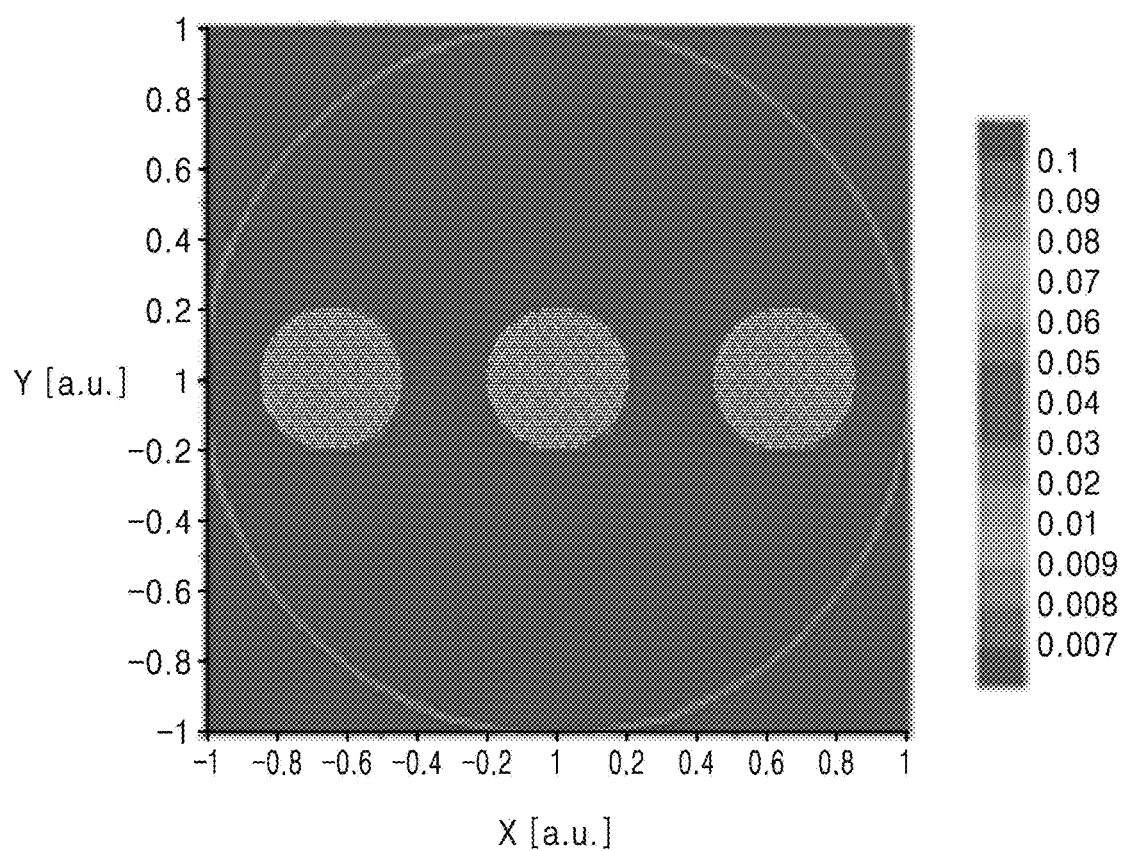
FIG. 5A is a photograph showing an image (i.e., a pupil image) of a pupil plane corresponding to a shape of an array area of FIG. 4A.
Figure 5B:
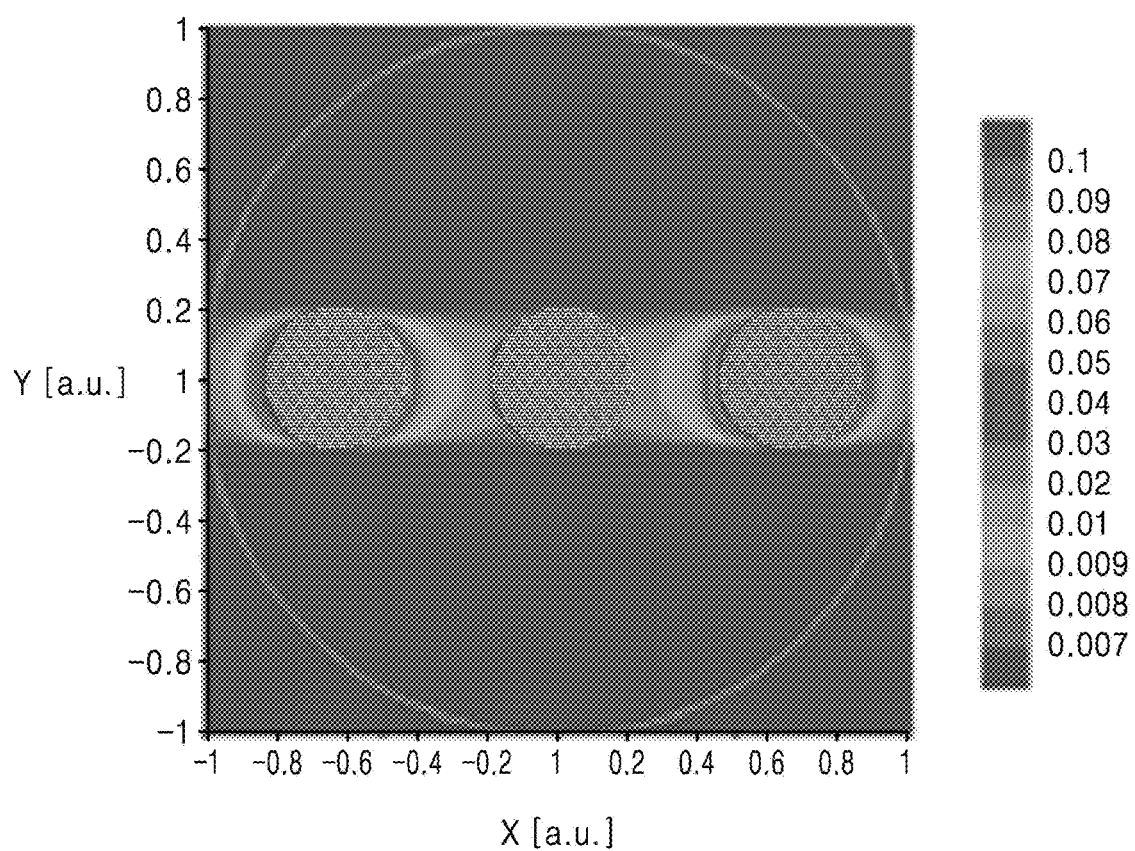
FIG. 5B is a photograph showing an image (i.e., a pupil image) of a pupil plane corresponding to a shape of an array area of FIG. 4B.

FIG. 5A is a photograph showing an image (i.e., a pupil image) of a pupil plane corresponding to a shape of an array area of FIG. 4A, and FIG. 5B is a photograph showing an image (i.e., a pupil image) of a pupil plane corresponding to a shape of an array area of FIG. 4B. In FIGS. 5A and 5B, an X axis and a Y axis represent positions and units of the X axis and the Y axis are arbitrary units.

Referring to FIG. 5A, FIG. 5A is a pupil image corresponding to a shape of the array area of FIG. 4A and shows that zero-order light (a circle at a center) and two pieces of $1^{st}$-order light (circles at both outer portions) are in clear circular shapes. This may be because one shot corresponding to FIG. 4A includes only an array area Aarr, and thus, diffracted light (i.e., $1^{st}$-order light) has only a certain diffraction angle.

Referring to FIG. 5B, FIG. 5B is a pupil image corresponding to a shape of the array area of FIG. 4B and shows that zero-order light (a circle of a center thereof) and two pieces of $1^{st}$-order light (circles of both outer portions) are in blurred shapes which spread in an X-axis direction. This may be because one shot corresponding to FIG. 4B includes an array area Aarr and an external area Aout, and thus, diffracted light (i.e., $1^{st}$-order light) further has a diffraction angle other than a certain diffraction angle. For example, the $1^{st}$-order diffracted light may have multiple diffraction angles and/or may have a blurred boundary when irregular patterns are included in a shot.

Figure 6A:
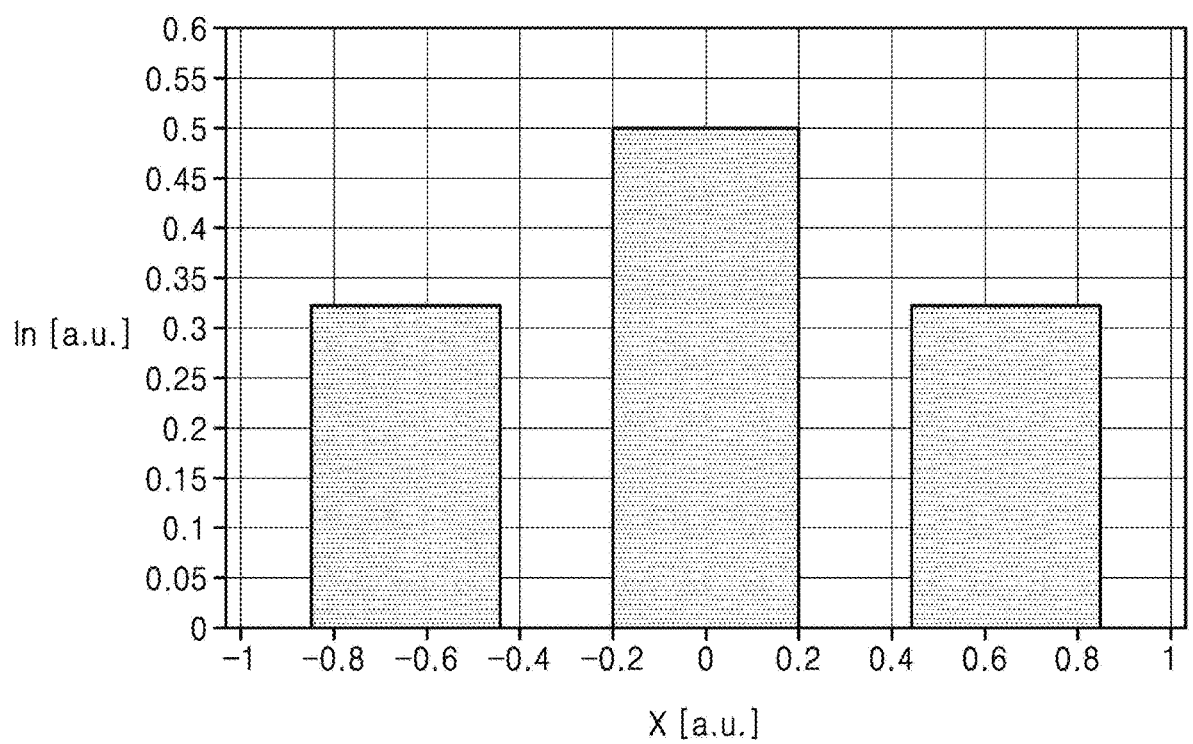
FIGS. 6A and 6B are graphs respectively showing intensities of pupil images of FIGS. 5A and 5B.
Figure 6B:
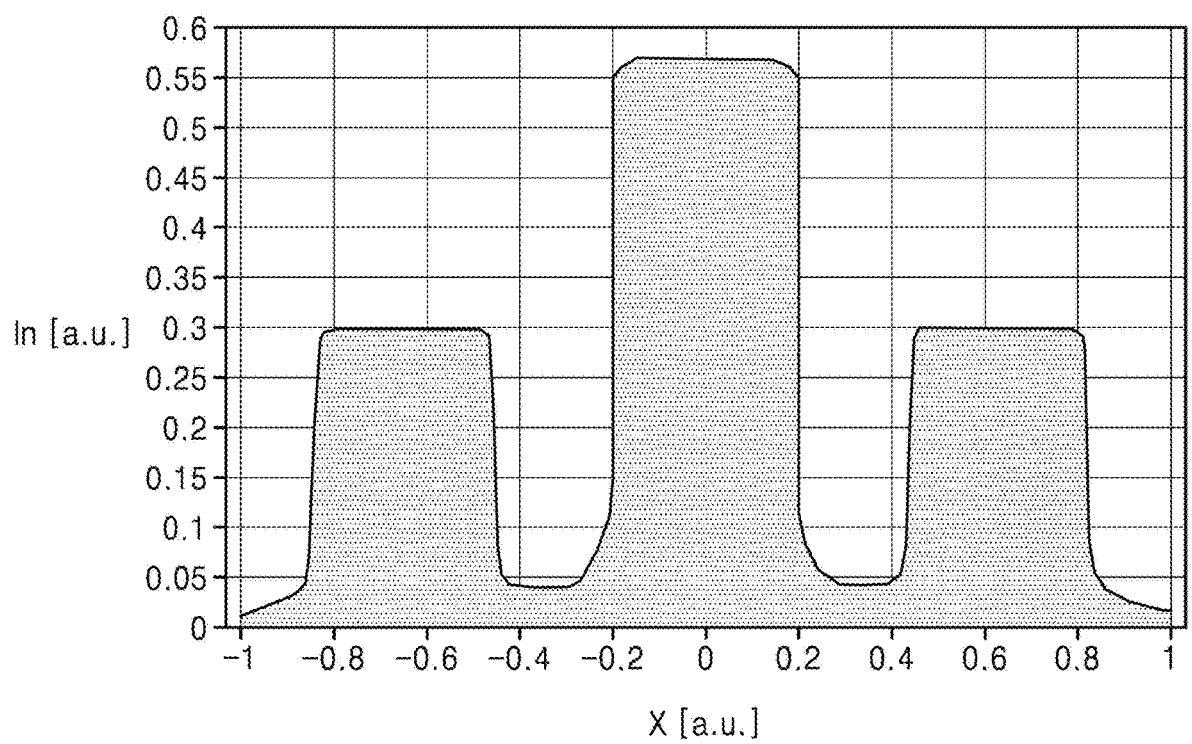

FIGS. 6A and 6B are graphs respectively showing intensities of pupil images of FIGS. 5A and 5B. In FIGS. 6A and 6B, an X axis represents a position, a Y axis represents intensity, and units of the X axis and the Y axis are arbitrary units.

Referring to FIG. 6A, the intensity of zero-order light at a center may be the highest, and intensities of pieces of $1^{st}$-order light at both sides may be lower than that of the zero-order light. Also, the intensities of the pieces of $1^{st}$-order light at both sides may be substantially the same. As shown in FIG. 6A, the zero-order light may be clearly differentiated from the pieces of $1^{st}$-order light. For example, the boundaries of the zero-order light and the $1^{st}$-order light of the diffracted light may be clear.

Terms such as "same," "equal," "planar," or "coplanar," as used herein when referring to orientation, layout, location, shapes, sizes, compositions, amounts, or other measures do not necessarily mean an exactly identical orientation, layout, location, shape, size, composition, amount, or other measure, but are intended to encompass nearly identical orientation, layout, location, shapes, sizes, compositions, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Referring to FIG. 6B, similarly to FIG. 6A, the intensity of zero-order light at a center may be the highest, and intensities of pieces of $1^{st}$-order light at both sides may be lower than that of the zero-order light. As shown in FIG. 6B, it may be seen that the zero-order light is not clearly differentiated from the pieces of $1^{st}$-order light, and moreover, a portion having an intensity of a small magnitude is between the zero-order light and the pieces of $1^{st}$-order light. The portion having the intensity of the small magnitude may correspond to a portion where the pieces of $1^{st}$-order light spread in FIG. 5B. For example, the portion having the intensity of the small magnitude may be based on $1^{st}$-order light having a different diffraction angle.

The measurement apparatus 1000 according to the present embodiment may use an on-off selection method which selects a pupil image including only an array area, uses the selected pupil image in measuring pattern uniformity, and removes a pupil image including a non-array area, e.g., in addition to the array area. For example, the measurement apparatus 1000 according to the present embodiment may select a pupil image where zero-order light is clearly differentiated from $1^{st}$-order light as shown in FIG. 5A and may remove a pupil image where zero-order light is not clearly differentiated from $1^{st}$-order light as shown in FIG. 5B. As described above, the measurement apparatus 1000 according to the present embodiment may measure pattern uniformity by using a pupil image including only an array area, thereby considerably enhancing an accuracy of measuring pattern uniformity.

The on-off selection method is not limited to that zero-order light is clearly differentiated from $1^{st}$-order light. For example, a pupil image may be selected based on only zero-order light or $1^{st}$-order light. For example, in a pupil image including only an array area, each of zero-order light and $1^{st}$-order light may be shown in a clear circular shape, and in a pupil image including an array area and a non-array area, each of zero-order light and $1^{st}$-order light may be shown in a blurred shape which spreads to both sides, e.g., in an X direction as shown in FIGS. 5B and 6B. Therefore, a pupil image may be selected based on clearness of one of zero-order light and $1^{st}$-order light.

Also, the on-off selection method of selecting a pupil image based on a distance between zero-order light and $1^{st}$-order light may be used. For example, in a pupil image including only an array area, a distance between zero-order light and $1^{st}$-order light may be clearly defined and may be constant. On the other hand, in a pupil image including an array area and a non-array area, a distance between zero-order light and $1^{st}$-order light may not be clearly defined or may not be constant, e.g., because of blurred boundaries of the zero-order light and the $1^{st}$-order light. This may be seen in the graphs of FIGS. 6A and 6B. For example, in the graph of FIG. 6A, zero-order light and $1^{st}$-order light may be clearly differentiated from each other, and thus, a distance therebetween may be defined and may be constant regardless of a magnitude of intensity. On the other hand, in the graph of FIG. 6B, it may be seen that zero-order light and $1^{st}$-order light are not clearly differentiated from each other and are shown in a combined shape, and thus, a distance therebetween is difficult to define and varies based on a magnitude of intensity.

Figure 7:
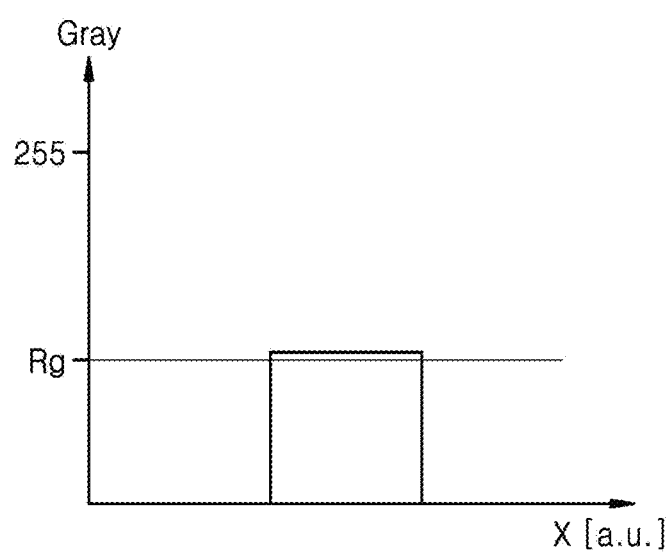
FIG. 7 is a graph for describing a method of determining uniformity of a pattern by using the measurement apparatus of FIG. 1.

FIG. 7 is a graph for describing a method of determining uniformity of a pattern by using the measurement apparatus of FIG. 1. X axis of FIG. 7 represents positions, the unit of the X axis is an arbitrary unit, and Y axis of FIG. 7 represents a gray scale.

Referring to FIG. 7, intensity of a pupil image may be represented by a gray scale. For example, the intensity of zero-order light in the intensity graph of FIG. 6A may be converted into a gray scale as shown in FIG. 7, and thus, an intensity graph of zero-order light may be represented by a certain grayscale value. Here, a grayscale value may be in a range of 0 to 255.

Pupil images, corresponding to various pitches and various patterns determined to be normal (e.g., in an acceptable range) may be obtained, calculation of intensity and conversion to a gray scale may be performed on each of the pupil images, and the calculated intensity may be stored as a reference grayscale value Rg, e.g., in a storage (not shown) of the measurement apparatus 1000. In the graph of FIG. 7, an example of the reference grayscale value Rg is illustrated by a solid line. For example, the reference grayscale value Rg may be used as a reference to determine uniformity of patterns in an array area.

Therefore, the measurement apparatus 1000 according to the present embodiment may measure the uniformity of a pattern in an array area of the measurement target 2000 through the following process. First, pupil images corresponding to the array area of the measurement target 2000 may be obtained, only a pupil image (including no noise—e.g., non-array area noise) having the same patterns may be extracted by determining the on/off of the pupil images, the intensity of each of the pupil images may be calculated, and the calculated intensity may be converted into a measurement grayscale value. Subsequently, uniformity may be calculated by comparing the measurement grayscale value with a corresponding reference grayscale value Rg. Here, the reference gray value Rg may be an average of measurement grayscale values, and a deviation (σ) value may be calculated based on the reference gray value Rg. For example, the deviation value may be calculated by dividing the measurement grayscale values by the reference grayscale value Rg. The deviation value may be represented by a % value, and the % value may be referred to as pattern uniformity. Whether the calculated uniformity is within an allowable range may be determined. When the calculated uniformity is within the allowable range, pattern uniformity may be determined to be normal/acceptable, and when the calculated uniformity is outside the allowable range, the pattern uniformity may be determined to be abnormal/unacceptable. Here, the allowable range may denote a certain range with respect to reference uniformity, and the reference uniformity may correspond to, for example, 100%. For example, these processes may be carried out by hardware/software, e.g., by a computer including a processor, etc.

As is traditional in the field of the disclosed technology, features and embodiments are described, and illustrated in the specification and drawings, in terms of units or modules, and/or in terms of performing, calculations, determinations, measurements, comparisons, and other functions. Those skilled in the art will appreciate that these units, modules, and functions are physically implemented by the physical components described in the various figures, combined with electronic (or optical) circuits such as logic circuits, discrete components, microprocessors, image processors, CPUs, hard-wired circuits, memory elements, wiring connections, and the like, which may be formed using semiconductor-based fabrication techniques or other manufacturing technologies. In the case of the units, modules, or functions being implemented by microprocessors or similar, they may be programmed using software (e.g., microcode) and may optionally be driven by firmware and/or software. Alternatively, certain units, modules, or functions may be implemented by dedicated hardware, or as a combination of dedicated hardware to perform some functions and a processor (e.g., one or more programmed microprocessors and associated circuitry) to perform other functions.

According to certain embodiments, a separate process of converting intensity into a gray scale may be omitted, and pattern uniformity may be measured based on a method of comparing intensity with pre-stored reference intensity.

Figure 8A:
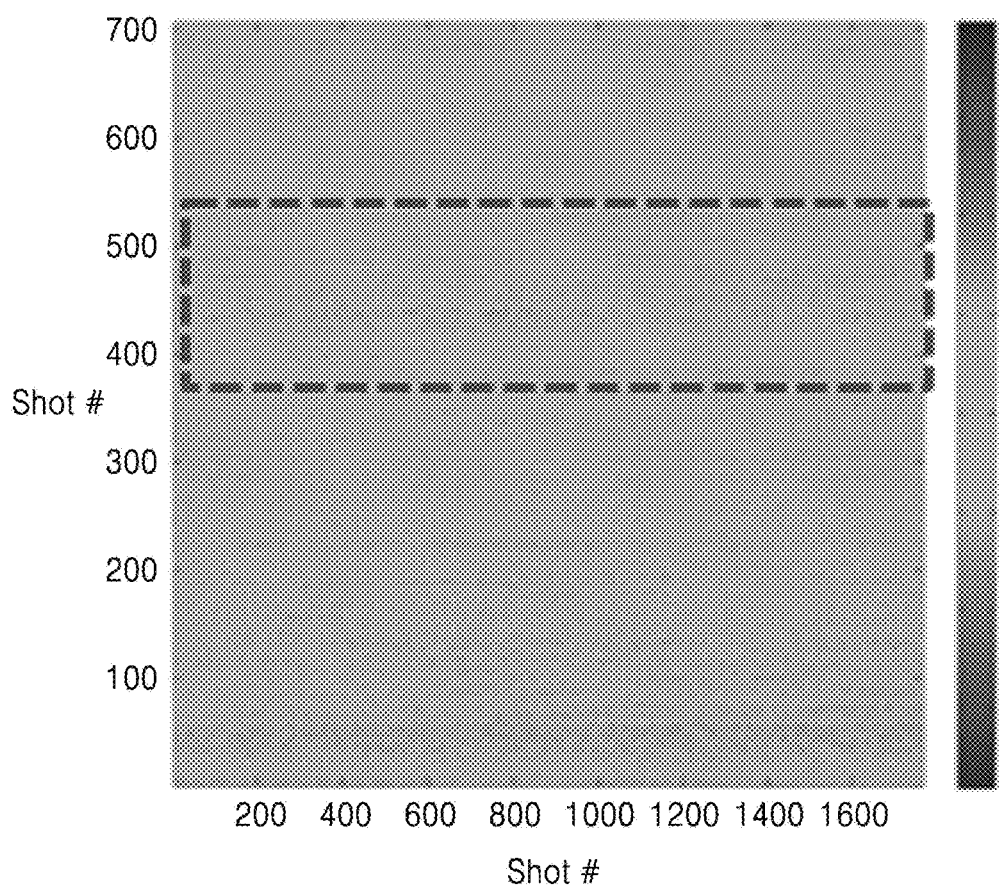
FIGS. 8A and 8B are photographs for describing a method of correcting/compensating fluctuation of light by using a second detector of the measurement apparatus of FIG. 1.
Figure 8B:
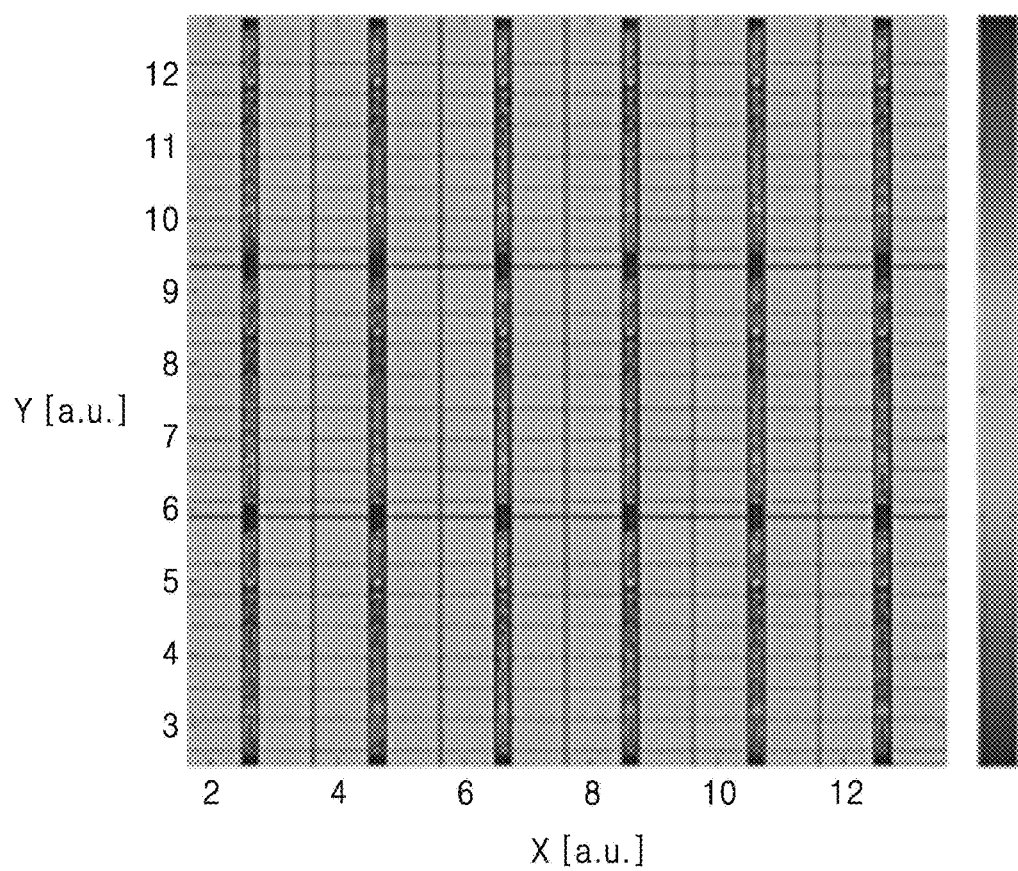

FIGS. 8A and 8B are photographs for describing a method of correcting/compensating fluctuation of light by using a second detector of the measurement apparatus of FIG. 1. FIG. 8A is a photograph of a bare intensity map obtained through the second detector, and FIG. 8B is a photograph of a pattern intensity map obtained through a first detector. For example, the bare intensity map may be a map of light source intensity. For example, the bare intensity map may be an intensity map of a light distribution without an obstacle between a light source and a sensing area of the light intensity. For example, the pattern intensity map may be a map of diffracted light by a measurement target. In the map/graph of FIG. 8A, an X axis represents a shot number, and a Y axis represents a shot number. For example, shots are arranged in a matrix-like arrangement. In the map/graph of FIG. 8B, an X axis represents a position (e.g., in an X direction), a Y axis represents a position (e.g., in a Y direction), and units of the X axis and the Y axis are arbitrary units. Hereinafter, the graphs of FIGS. 8A and 8B will be described with reference to FIG. 1, and descriptions given above with reference to FIG. 1 will be briefly given or will be omitted.

Referring to FIG. 8A, the second detector 400-2 may directly detect the light L2 coming from the beam splitter 220 without/regardless of the measurement target 2000. Therefore, a bare intensity map (e.g., a map of intensity of light coming from the light source) may be represented by intensity based on a shot number regardless of the measurement target 2000. As seen in FIG. 8A, fluctuation of light based on shots (e.g., by shots) may be checked/detected. For example, a tetragonal portion illustrated by a dashed line may correspond to a portion where fluctuation of light occurs largely. When a pattern uniformity is measured without compensating fluctuation of source light, a distorted/inaccurate value of uniformity may be obtained.

Referring to FIG. 8B, the first detector 400-1 may detect light which is generated when the first light L1 from the beam splitter 220 is diffracted by passing through the measurement target 2000. For example, the first detector 400-1 may detect a diffracted light by the measurement target 2000. A pattern intensity map may be associated with a pattern of the measurement target 2000, and thus, may be represented by intensity based on positions of the measurement target 2000. For reference, the first light L1 and the second light L2 may be pieces of light which are split from the light L output from the same light source 100, and thus, may have substantially the same fluctuation of light. Therefore, fluctuation of light in the bare intensity map may be substantially the same as fluctuation of light in the pattern intensity map. The bare intensity map may not be affected by the pattern of the measurement target 2000, and thus, fluctuation of light may be readily/immediately extracted. However, in the pattern intensity map, the pattern of the measurement target 2000 may influence the pattern intensity map, and thus, it may be unable to clearly determine and extract fluctuation of light. Therefore, the pattern intensity map may be corrected/compensated by reflecting light fluctuation information obtained from the bare intensity map, and thus, a more accurate pattern intensity map may be obtained by removing fluctuation of light therefrom.

The measurement apparatus 1000 according to the present embodiment, by using the second detector 400-2, may directly detect the second light L2 which does not pass through the measurement target 2000 (i.e., which is not diffracted), and thus, may obtain information about fluctuation of light in real time. Here, real time may denote a time which is substantially the same as a time for detecting a pupil image of the measurement target 2000 by using the first detector 400-1. As a result, the measurement apparatus 1000 according to the present embodiment may obtain in real time information about fluctuation of light by using the second detector 400-2 and may correct/compensate uniformity of a pattern and/or a pupil image obtained by the first detector 400-1 on the basis of the information about the fluctuation of the source light, thereby considerably enhancing an accuracy of measuring uniformity of a pattern.

FIGS. 9 and 10 are block diagrams of a measurement apparatus for measuring pattern uniformity on the basis of a pupil image, according to example embodiments. Hereinafter, a measurement apparatus according to the example embodiments will be described with reference to FIGS. 9 and 10 in conjunction with FIG. 1, and descriptions given above with reference to FIGS. 2 to 8B will be briefly given or will be omitted.

Referring to FIG. 9, a function and a configuration of a beam splitter 220a of an optical system 200a of a measurement apparatus 1000a according to the present embodiment may differ from those of the measurement apparatus 1000 of FIG. 1. More specifically, the measurement apparatus 1000a according to the present embodiment may include a light source 100, the optical system 200a, a stage 300, a detection unit 400, and an AIU 500. The light source 100, the stage 300, the detection unit 400, and the AIU 500 may be the same as the ones described with respect to the measurement apparatus 1000 of FIG. 1.

An IFS 210, a PCM 230, and an HNA 240 of the optical system 200a may be the same as the ones described with respect to the optical system 200 of the measurement apparatus 1000 illustrated in FIG. 1. The beam splitter 220a may split the light L, output from the IFS 210, into two pieces of light (for example, first light L1 and second light L2). As illustrated in FIG. 9, the beam splitter 220a may transmit a portion of the light L coming from the IFS 210 to allow the first light L1 to travel to the measurement target 2000 and may reflect the other portion of the light L to allow the second light L2 to travel to the second detector 400-2.

In the measurement apparatus 1000a according to the present embodiment, the beam splitter 220a may have a modified function (e.g., different functions from the previous ones). For example, the arrangement positions of optical elements and detectors may be different from the previously described embodiments with respect to the beam splitter 220a. For example, the second detector 400-2 may be disposed in a direction and/or a position in which a light coming from the light source 100 is reflected by the beam splitter 220a, and the PCM 230, the HNA condenser 240, the stage 300, and the first detector 400-1 may be disposed in a direction and/or positions that the light coming from the light source 100 passing through the beam splitter 220a.

According to an embodiment, an additional beam splitter may be further disposed between the beam splitter 220a and the PCM 230, a third detector may detect light passing through the additional beam splitter, and the first detector 400-1 may detect light reflected by the additional beam splitter. Similarly, in the measurement apparatus 1000 of FIG. 1, an additional beam splitter may be further disposed between the IFS 210 and the beam splitter 220, a third detector may detect light reflected by the additional beam splitter, and light passing through the additional beam splitter may be incident on the beam splitter 220.

Referring to FIG. 10, a measurement apparatus 1000b according to the present embodiment may be a reflective measurement apparatus, and thus, may differ from the measurement apparatus 1000 of FIG. 1. More specifically, the measurement apparatus 1000b according to the present embodiment may include a light source 100, an optical system 200b, a stage 300a, a detection unit 400, and an AIU 500. The light source 100, the detection unit 400, and the AIU 500 may be the same as the ones described with respect to the measurement apparatus 1000 of FIG. 1.

The optical system 200*b* may include two beam splitters (for example, first and second beam splitters) 220-1 and 220-2, and thus, may differ from the optical system 200 of the measurement apparatus 1000 of FIG. 1. An IFS 210, a PCM 230, and an HNA 240 may be also included in the optical system 200*b* and may be the same as the ones described with respect to the optical system 200 of the measurement apparatus 1000 illustrated in FIG. 1. The first beam splitter 200-1 of the two beam splitters (the first and second beam splitters 220-1 and 220-2) may be substantially the same as the beam splitter 220 of the measurement apparatus 1000 of FIG. 1. Therefore, the first beam splitter 220-1 may split light L, output from the light source 100, into two pieces of light. For example, the first beam splitter 220-1 may split light L, output from the light source 100, into first light L1 and second light L2. The first light L1 may be irradiated onto the measurement target 2000, and the second light L2 may be irradiated onto the second detector 400-2.

The second beam splitter 220-2 of the two beam splitters (the first and second beam splitters 220-1 and 220-2) may be disposed between the PCM 230 and the HNA condenser 240. The second beam splitter 220-2 may transmit the first light L1 to allow the first light L1 to be irradiated onto the measurement target 2000 and may reflect light reflected from the measurement target 2000 to allow the reflected light to be irradiated onto the first detector 400-1. According to an embodiment, the second beam splitter 220-2 may reflect the first light L1 to allow the reflected first light L1 to be irradiated onto the measurement target 2000 and may transmit light reflected from the measurement target 2000 to allow the reflected light to be irradiated onto the first detector 400-1, e.g., differently from the illustration of FIG. 10.

The measurement target 2000 may be disposed on the stage 300*a*, and the stage 300*a* may support and fix the measurement target 2000. Because the measurement apparatus 1000*b* according to the present embodiment is a reflective measurement apparatus, the stage 300*a* may support and fix a bottom surface of the measurement target 2000. The stage 300*a* may be a 3D movable stage which is three-dimensionally movable, and as the stage 300*a* moves, the measurement target 2000 may move together therewith.

The first light L1 may be condensed through the HNA condenser and may be irradiated onto and reflected by the measurement target 2000. Light reflected by the measurement target 2000 may be diffracted based on a pattern included in the measurement target 2000. For example, the first light L1 may be reflected and diffracted by the measurement target 2000, and thus, may be converted into diffracted light DL. The diffracted light DL based on reflection may include $2^{nd}$ or higher-order pieces of light. However, for convenience, the diffracted light DL is illustrated as including zero-order light and $1^{st}$-order light in FIG. 10. For example, second and higher order of light diffractions are omitted in FIG. 10 for a simpler illustration. Also, the diffracted light DL may be incident on the first detector 400-1 via the HNA condenser 240 and the second beam splitter 220-2, but for convenience, in elements next to the HNA condenser 240, the diffracted light DL is not illustrated as being split into zero-order light and $1^{st}$-order light and is illustrated as only one light (e.g., illustrated as one line of a beam).

In the measurement apparatus 1000*b* according to the present embodiment, the first detector 400-1 may detect a pupil image of a pupil plane PP1 with respect to the diffracted light DL by a reflection. Also, the second detector 400-2 may detect a pupil image of a pupil plane PP2 with respect to the second light L2 from the first beam splitter 220-1.

FIGS. 11A to 11D are flowcharts simply illustrating a measurement method of measuring pattern uniformity on the basis of a pupil image, according to an embodiment. Hereinafter, a measurement method according to embodiments will be described with reference to FIGS. 11A to 11D in conjunction with FIG. 1, and descriptions given above with reference to FIGS. 1 to 10 will be briefly given or will be omitted.

Figure 11A:
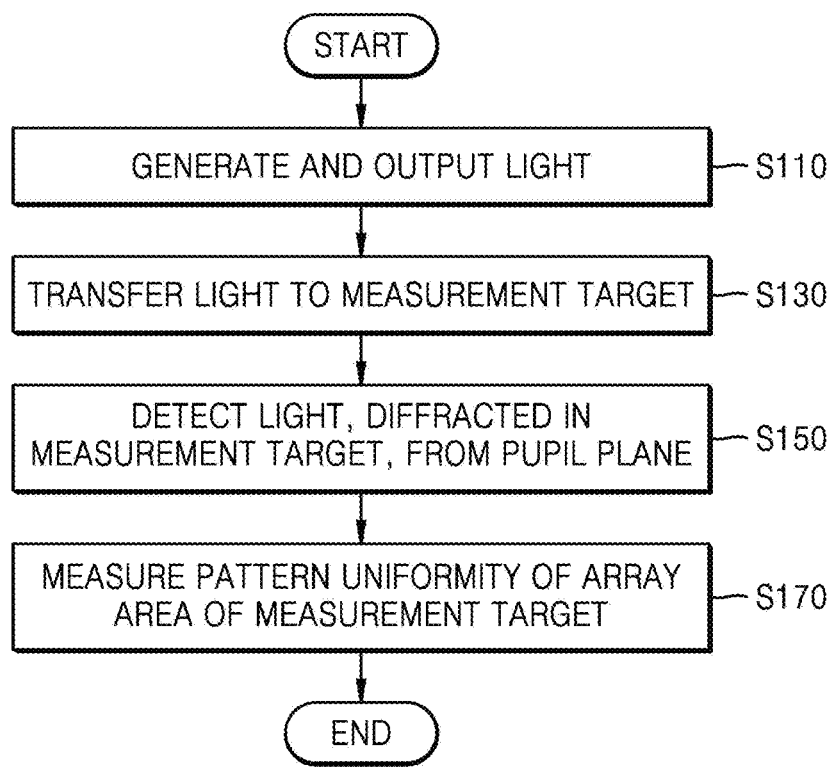
FIGS. 11A to 11D are flowcharts simply illustrating a measurement method of measuring pattern uniformity on the basis of a pupil image, according to an embodiment.

Referring to FIG. 11A, in a method (hereinafter referred to as a measurement method) of measuring pattern uniformity on the basis of a pupil image according to the present embodiment, first, the light source 100 may generate and output light in operation S110. The light of the light source 100 may include, for example, a pulse laser, and may have a pulse width of about 500 Hz to about 1 kHz and may have a wavelength of about 200 nm. For example, the pulse laser may have a 50% duty cycle. The light of the light source 100 is not limited to the pulse laser. Also, a pulse width or a wavelength of the pulse laser is not limited to the above numerical value.

Subsequently, in operation S130, the light may be transferred to the measurement target 2000 by using the optical system 200. For example, the light from the light source 100 may be shaped by the IFS 210 and may be reflected or transmitted by the beam splitter 220, the PCM 230 may control a polarization state, and the HNA condenser 240 may condense the light and may irradiate the condensed light onto the measurement target 2000. For example, in a case where light is reflected by the beam splitter 220 and is irradiated onto the measurement target 2000, the measurement apparatus 1000 of FIG. 1 may be used, and in a case where light passes through the beam splitter 220 and is irradiated onto the measurement target 2000, the measurement apparatus 1000*a* of FIG. 9 may be used.

Subsequently, in operation S150, light diffracted by the measurement target 2000 may be detected from a pupil plane by using the first detector 400-1. The first detector 400-1 may include a CCD or a PMT and may detect an image (i.e., a pupil image) of the pupil plane corresponding to the diffracted light. The diffracted light may be light which is transmitted through and diffracted by the measurement target 2000, or may be light which is reflected and diffracted by the measurement target 2000. In a case where the diffracted light is light which is transmitted through and diffracted by the measurement target 2000, the measurement apparatus 1000 of FIG. 1 or the measurement apparatus 1000*a* of FIG. 9 may be used, and in a case where the diffracted light is reflected and diffracted by the measurement target 2000, the measurement apparatus 1000*b* of FIG. 10 may be used.

After the pupil image is detected, the pattern uniformity of an array area of the measurement target 200 may be measured in operation S170. In measuring the pattern uniformity of the array area, as described above, the intensity of the pupil image may be calculated and converted into a measurement grayscale value, and the measurement grayscale value may be compared with the reference grayscale value Rg. By measuring pattern uniformity like the above-described method, the measurement method according to the present embodiment may accurately measure the pattern uniformity of the array area of the measurement target 2000, and thus, may accurately determine whether the pattern uniformity of the array area of the measurement target 2000 is normal/acceptable.

Figure 11B:
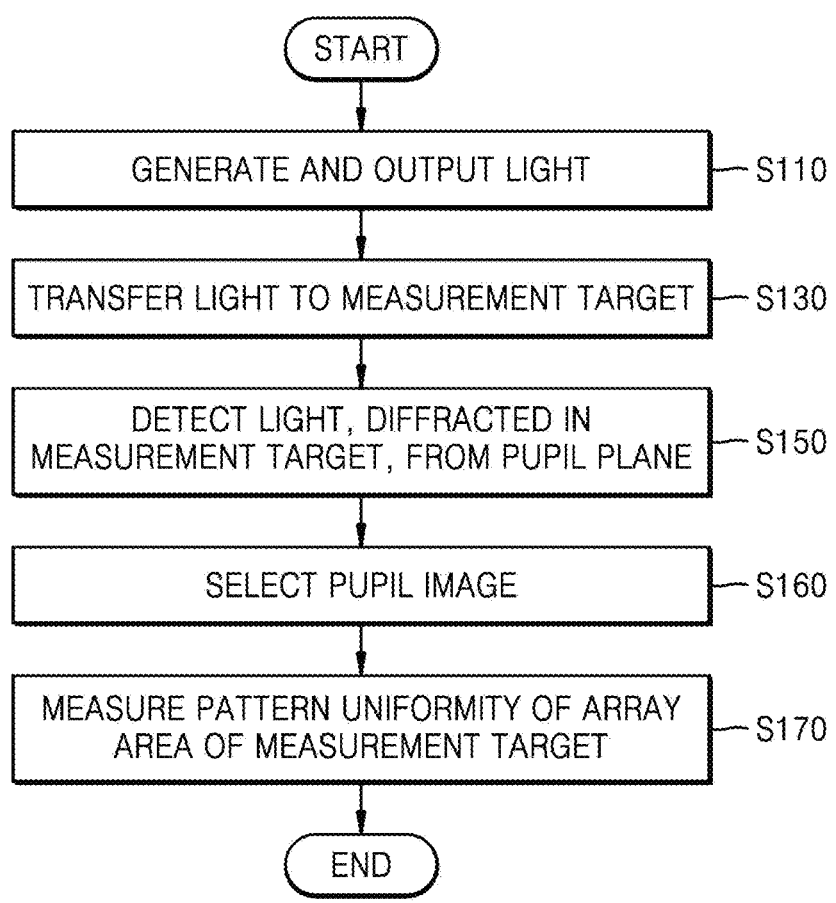

Referring to FIG. 11B, a measurement method according to the present embodiment may further include operation S160 of selecting a pupil image, and thus, may differ from the measurement method of FIG. 11A. For example, the measurement method according to the present embodiment may sequentially perform operation S110 of generating and outputting light, operation S130 of transferring the light to the measurement target 2000, and operation S150 of detecting the light from a pupil plane, and the operations may be the same as the ones described above with respect to the measurement method of FIG. 11A.

Subsequently, in operation S160, a pupil image including only the array area of the measurement target 2000 may be selected from among a plurality of pupil images. For example, as described above with reference to FIGS. 4A to 6B, by using the on-off selection method, a pupil image including only an array area may be selected, and a pupil image including a non-array area and an array area may be removed. For example, a plurality of pupil images of a plurality of shots may be examined to choose which pupil images are used to determine a pattern uniformity of a mask.

After the pupil image is selected, operation S170 of measuring pattern uniformity may be performed. Operation S170 of measuring pattern uniformity may be the same as the operation S170 described with respect to the measurement method of FIG. 11A. However, in operation S170 of measuring pattern uniformity, a pupil image including only an array area selected by the on-off selection method may be used to measure pattern uniformity.

Figure 11C:
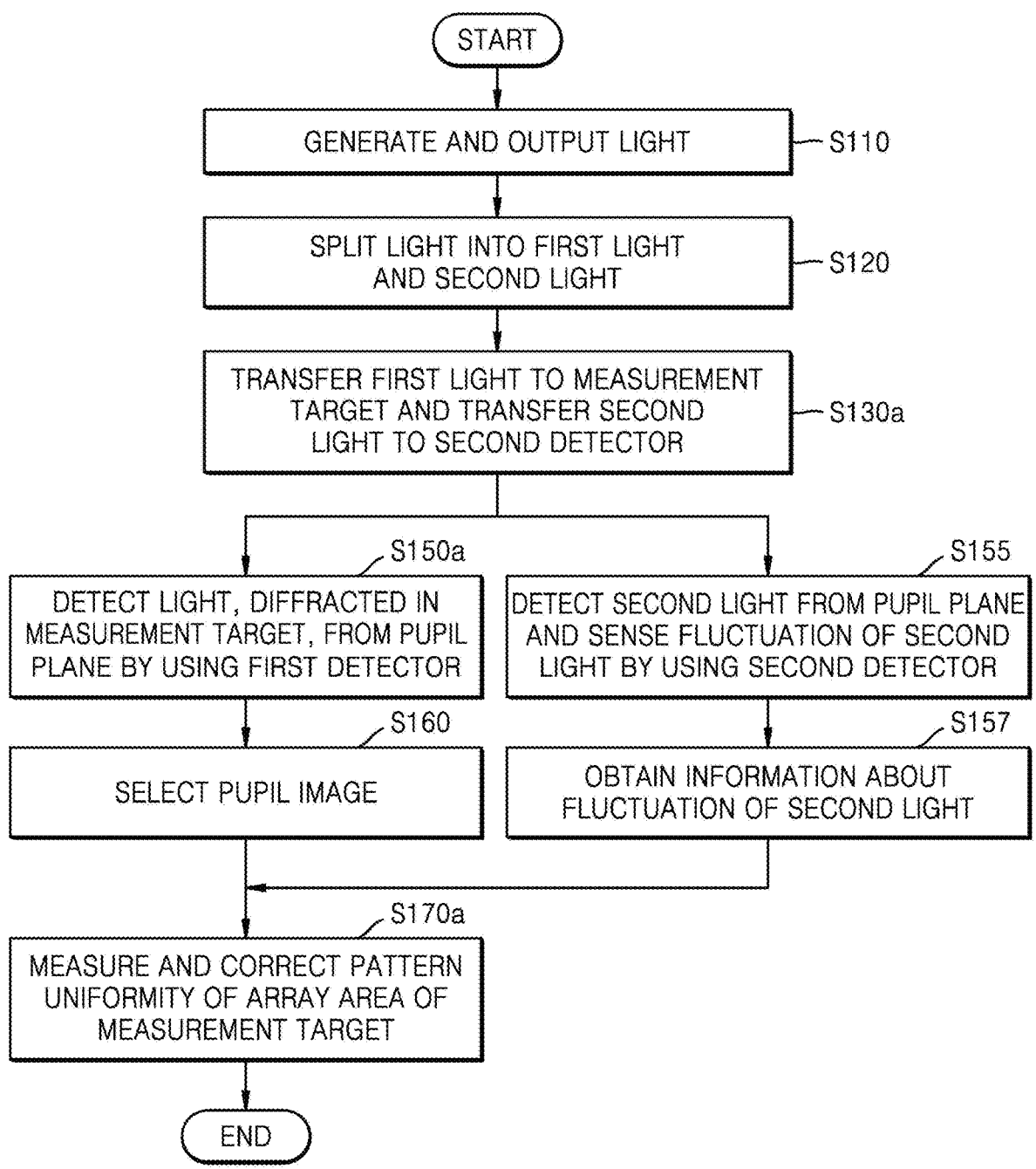

Referring to FIG. 11C, a measurement method according to the present embodiment may correct/compensate pattern uniformity (e.g., a measured pattern uniformity by the first detector 400-1) by using the second detector 400-2, and thus, may differ from the measurement method of FIG. 11B. For example, the measurement method according to the present embodiment may perform operation S110 of generating and outputting light, and then, may split the light into first light L1 and second light L2 by using the beam splitter 220 in operation S120. Subsequently, in operation S130*a*, the first light L1 may be transferred to the measurement target 200 by using the optical system 200, and the second light L2 may be transferred to the second detector 400-2.

Subsequently, based on the first light L1, light diffracted by the measurement target 2000 may be detected from a pupil plane by the first detector 400-1 in operation S150*a*, and a pupil image may be selected by using the on-off selection method in operation S160. Operation S150*a* of detecting the light from the pupil plane and operation S160 of selecting the pupil image may be the same as corresponding operations described above with reference to FIGS. 11A and 11B.

Based on the second light L2, by using the second detector 400-2, the second light L2 may be detected from the pupil plane and fluctuation of the second light L2 may be sensed in operation S155, and fluctuation information about the second light L2 may be obtained in operation S157.

Subsequently, in operation S170*a*, the pattern uniformity of the array area of the measurement target 2000 may be measured and corrected/compensated. An operation of measuring pattern uniformity may be the same as the operation described with respect to the measurement method of FIG. 11A. An operation of correcting pattern uniformity may be performed based on the following two methods. A first method may be a method which corrects/compensates a pupil image on the basis of the fluctuation information about the second light L2 and measures the pattern uniformity of the array area of the measurement target 2000 by using the corrected/compensated pupil image. A second method may be a method which measures the pattern uniformity of the array area of the measurement target 2000 by using a pupil image stored in advance, e.g., in a database including a correlation between fluctuation of light and the pattern uniformity, and corrects/compensates the pattern uniformity on the basis of the stored data by using fluctuation information about light.

Figure 11D:
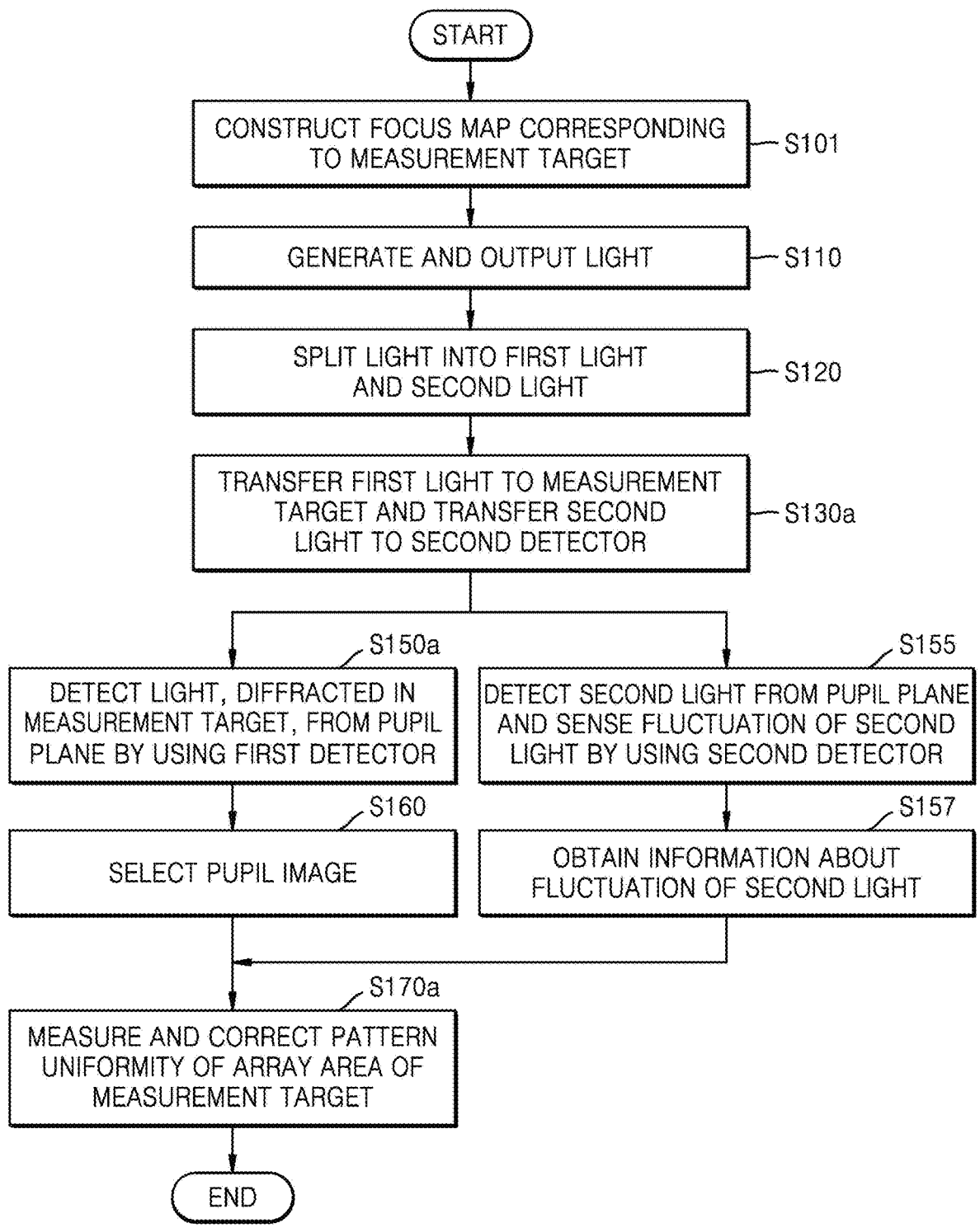

Referring to FIG. 11D, a measurement method according to the present embodiment may construct a focus map corresponding to the measurement target 2000 in operation S101, and thus, may differ from the measurement method of FIG. 11C. For example, before generating and outputting light, the measurement method according to the present embodiment may construct a focus map corresponding to the measurement target 2000 in operation S101. Generally, an operation of capturing an image by using a detector may be performed after focusing each of corresponding areas. However, in a case where photographing (capturing images) is performed tens of thousands to hundreds of thousands times because a measurement area (i.e., an array area) of the measurement target 2000 is wide, performing an operation of individually adjusting focus each time may take a long time to finish to capture throughout the wide measurement area of the measurement target 2000. Therefore, in the measurement method according to the present embodiment, a focus map corresponding to the measurement target 2000 may be previously constructed, and then, in a case which detects a pupil image by using the first detector 400-1, focusing may be automatically performed based on the focus map, whereby an individual focus adjustment process may be omitted. Accordingly, a time for detecting a pupil image by using the first detector 400-1 may be considerably reduced. According to an embodiment, the focus map may be reflected/used in operation S170*a* of measuring and correcting pattern uniformity.

In order to decrease a time for detecting a pupil image by using the first detector 400-1, in operation S150*a* of detecting the light from the pupil plane, the first detector 400-1 may detect a pupil image at only positions of the measurement target 2000 which are set through sampling. For example, before operation S101 of constructing the focus map, a sampling operation of selecting positions, from which a pupil image is to be detected/obtained, in the measurement target 2000 may be performed. Subsequently, in operation S101 of constructing the focus map, the focus map may be constructed at only positions selected through the sampling operation.

After operation S101 of constructing the focus map, operations from operation S110 of generating and outputting the light to operation S170*a* of measuring and correcting the pattern uniformity may be the same as the operations described with respect to the measurement method of FIG. 11C.

Figure 12:
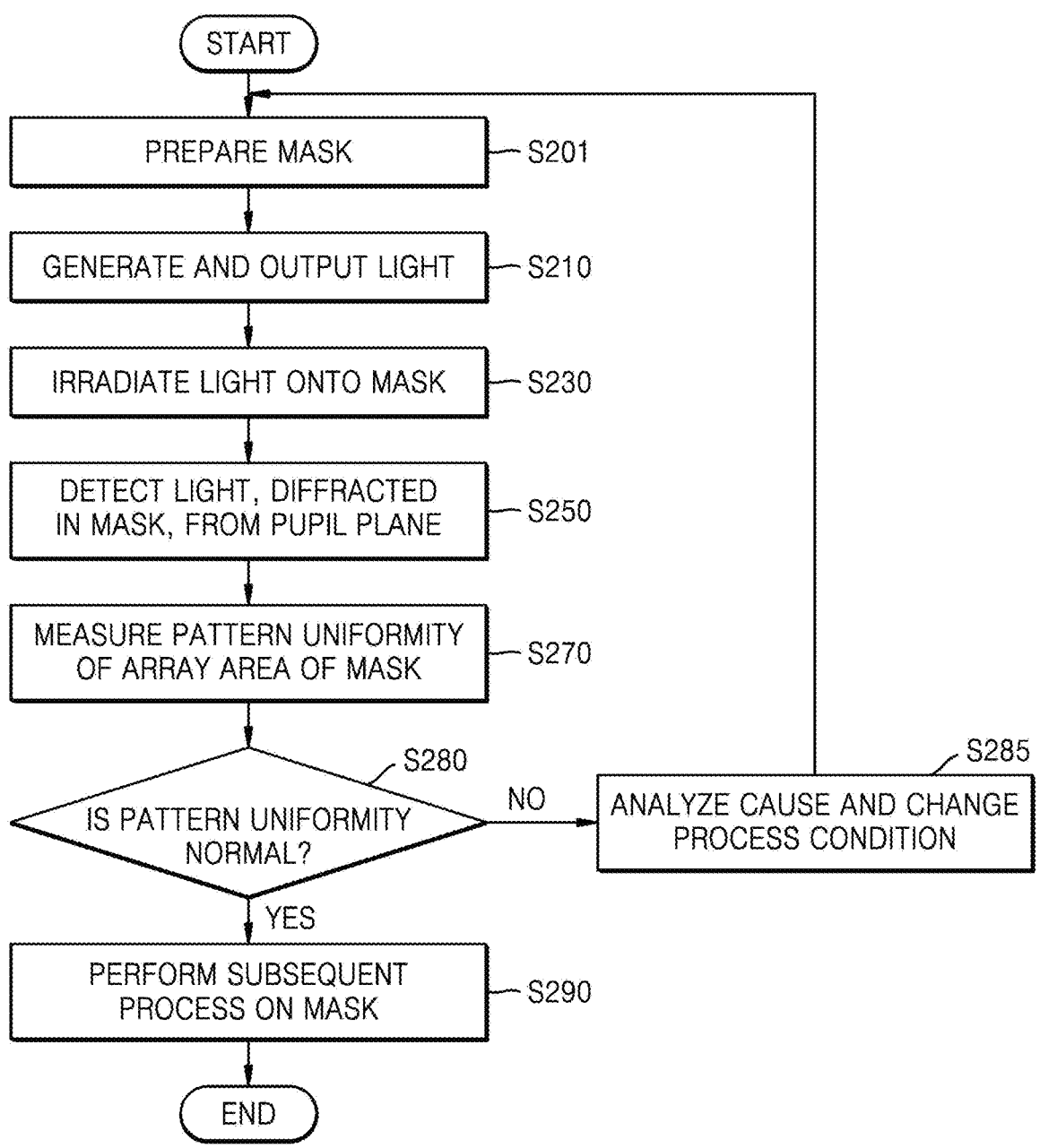
FIG. 12 is a flowchart simply illustrating a method of manufacturing a mask by using the measurement method of FIG. 11A, according to an embodiment.

FIG. 12 is a flowchart simply illustrating a method of manufacturing a mask by using the measurement method of FIG. 11A, according to an embodiment. Hereinafter, a method of manufacturing a mask according to an embodiment will be described with reference to FIG. 12 in conjunction with FIG. 1, and descriptions given above with reference to FIGS. 11A to 11D will be briefly given or will be omitted.

Referring to FIG. 12, first, in the method of manufacturing a mask according to the present embodiment, a mask may be prepared in operation S201. The mask may be the measurement target 2000 and may include an array area, and a plurality of repetition patterns may be disposed in the array area. Operation S201 of preparing the mask may include a process of forming a pattern in the array area of the mask. For example, in operation S201 of preparing the mask, the pattern may be formed in the array area of the mask through a process such as a process of designing a pattern, an optical proximity correction (OPC) process, a process of preparing mask data, and an exposure process.

Subsequently, operations from operation S210 of generating and outputting light to operation S270 of measuring pattern uniformity may be sequentially performed. The operations from operation S210 of generating and outputting the light to operation S270 of measuring the pattern uniformity may be the same as the operations described with respect to the measurement method of FIG. 11A. For example, the operations from operation S210 of generating and outputting the light to operation S270 of measuring the pattern uniformity may be applied to the mask.

After operation S270 of measuring the pattern uniformity, whether the pattern uniformity of the array area of the mask is normal/acceptable may be determined in operation S280. As described above, when the calculated uniformity is within an allowable range, the uniformity of the pattern may be determined to be normal/pass, and when the calculated uniformity is outside the allowable range, the uniformity of the pattern may be determined to be abnormal/fail.

When the uniformity of the pattern is normal/pass (Yes), a subsequent process may be performed on the mask in operation S290. The subsequent process performed on the mask may include a process of coating a pellicle on the mask and a finishing process performed on the mask. The finishing process performed on the mask may include, for example, a process of loading and keeping mask or a document processing process of recording a finished date. The mask may be finished through the subsequent process performed on the mask.

When the uniformity of the pattern is abnormal/fail (No), the cause thereof may be analyzed and the process condition may be changed in operation S285. Here, the process condition may denote a process condition for the process of forming the pattern in the array area of the mask. After the process condition is changed, operation S201 of preparing the mask may be performed. In operation S201 of preparing the mask, the changed process condition may be applied to the process of forming the pattern in the array area of the mask.

A method of manufacturing a mask on the basis of the measurement method of FIG. 11A has been described above, but is not limited thereto and may be performed based on one of the measurement methods of FIGS. 11B to 11D. Also, the method of manufacturing a mask according to the present embodiment may be applied to all kinds of devices based on the measurement methods of FIGS. 11A to 11D. For example, the measurement methods of FIGS. 11A to 11D may be applied to a method of measuring uniformity of a pattern of an array area of a wafer, and thus, the method of manufacturing a mask according to the present embodiment may be applied to a semiconductor device included in a wafer.

While the inventive concept has been particularly shown and described with reference to embodiments thereof, it will be understood that various changes in form and details may be made therein without departing from the spirit and scope of the following claims.

What is claimed is:

1. A method of measuring pattern uniformity on the basis of a pupil image, the method comprising:
generating and outputting light by using a light source;
transferring, by using an optical system, the light from the light source to a measurement target disposed on a stage, wherein the measurement target comprises an array area of repeating patterns;
detecting, by using a first detector, light reflected and diffracted by the measurement target or light diffracted by passing through the measurement target; and
measuring pattern uniformity of the repeating patterns of the array area of the measurement target on the basis of the light detected by the first detector, wherein
the detecting of the light comprises detecting a pupil image of a pupil plane by using the first detector, and
the measuring of the pattern uniformity of the repeating patterns comprises measuring the pattern uniformity of the repeating patterns on the basis of detecting the intensity of at least one of zero-order light and 1st-order light of the pupil image.

2. The method of claim 1, wherein:
the measurement target comprises a mask,
the first detector detects a pupil image of light diffracted by passing through the mask, and a size of one shot of the first detector is about 40 μm*40 μm,
the method further comprises, before the measuring of the pattern uniformity,
selecting the pupil image,
the selecting of the pupil image comprises, based on that a diffraction angle of diffracted light in the array area differs from a diffraction angle of diffracted light in an area other than the array area, determining whether the pupil image includes only the array area or at least a portion of the area other than the array area, and selecting the pupil image including only the array area, and
the measuring of the pattern uniformity comprises using the selected pupil image including only the array area in measuring the pattern uniformity.

3. The method of claim 2, wherein:
the first detector comprises a charge coupled device (CCD) or a photo multiplier tube (PMT),
the detecting of the light comprises sensing the intensity of the zero-order light, the intensity of the $1^{st}$-order light, or the intensities of the zero-order light and the $1^{st}$-order light by using the first detector, and
the measuring of the pattern uniformity comprises calculating intensity as a gray scale and measuring the pattern uniformity of the array area on the basis of the gray scale.

4. The method of claim 1, wherein:
the transferring of the light to the measurement target comprises splitting the light into first light and second light by using a beam splitter, irradiating the first light onto the measurement target, and irradiating the second light onto a second detector,
the detecting of the light comprises detecting, by using the second detector, a pupil image of the second light to sense fluctuation of the second light in real time, and
the measuring of the pattern uniformity comprises compensating a pupil image of the first light or compensating the pattern uniformity, based on information about the fluctuation of the second light.

5. The method of claim 1, wherein:
a size of one shot of the first detector varies for each measurement target, based on a pattern of the array area, the detecting of the light comprises detecting, by using the first detector, a pupil image corresponding to an entire surface of the measurement target through full scanning, or detecting, by using the first detector, a pupil image corresponding to each of set positions of the measurement target through sampling.

6. The method of claim 1, further comprising, before the transferring of the light to the measurement target, constructing a focus map corresponding to an entire surface of the measurement target, wherein the detecting of the light comprises automatically performing focusing on the basis of the focus map, or the measuring of the pattern uniformity comprises reflecting the focus map in a measurement result of the pattern uniformity.

7. A method of manufacturing a mask, the method comprising:

preparing a mask having an array area of repeating patterns;

generating and outputting light by using a light source;

transferring, by using an optical system, the light from the light source to the mask disposed on a stage;

detecting, by using a first detector, light reflected and diffracted by the mask or light diffracted by passing through the mask; and measuring pattern uniformity of the repeating patterns of the array area on the basis of the light detected by the first detector;

wherein the detecting of the light comprises detecting a pupil image of a pupil plane by using the first detector, and wherein the measuring of the pattern uniformity of the repeating patterns is performed on the basis of detecting the intensity of at least one of zero-order light and $1^{st}$-order light of the pupil image.

8. The method of claim 7, wherein:

the first detector is configured to detect a pupil image corresponding to light diffracted by passing through the mask, and a size of one shot of the first detector is about 40 μm*40 μm, the method further comprises, before the measuring of the pattern uniformity, selecting the pupil image, the selecting of the pupil image comprises, based on that a diffraction angle of diffracted light in the array area differs from a diffraction angle of diffracted light in an area other than the array area, determining whether the pupil image includes only the array area or the pupil image includes at least a portion of the area other than the array area and selecting the pupil image including only the array area, and the measuring of the pattern uniformity comprises using the selected pupil image including only the array area.

9. The method of claim 7, wherein:

the transferring of the light to the mask comprises splitting the light into first light and second light by using a beam splitter, irradiating the first light onto the mask, and irradiating the second light onto a second detector, the method further comprises detecting, by using the second detector, a pupil image corresponding to the second light to sense fluctuation of the second light in real time, and the measuring of the pattern uniformity comprises compensating a pupil image corresponding to the first light or compensating the pattern uniformity, based on information about the fluctuation of the second light.

10. The method of claim 7, wherein:

a size of one shot of the first detector varies for each mask, based on a pattern of the array area, the method comprises, before the transferring of the light to the mask, constructing a focus map corresponding to an entire surface of the mask, the detecting of the light comprises automatically performing focusing on the basis of the focus map, or the measuring of the pattern uniformity comprises reflecting the focus map in a measurement result of the pattern uniformity, and the detecting of the light comprises detecting, by using the first detector, a pupil image corresponding to an entire surface of the mask through full scanning of the entire surface, or detecting, by using the first detector, a pupil image corresponding to each of set positions of the mask through sampling.

11. The method of claim 7, further comprising, when the pattern uniformity is abnormal, analyzing a cause thereof, changing a process condition for a process of forming the array area, and preparing the mask.

* * * * *